United States Patent
Kim et al.

(10) Patent No.: US 11,482,579 B2
(45) Date of Patent: Oct. 25, 2022

(54) DISPLAY APPARATUS INCLUDING WAVE ABSORBER FOR ABSORBING LIGHT

(71) Applicant: LG Display Co., Ltd., Seoul (KR)

(72) Inventors: JinRyun Kim, Paju-si (KR); JaeJung Han, Paju-si (KR); SeMin Lee, Paju-si (KR); DaeYong Kim, Paju-si (KR); Eunhee Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 245 days.

(21) Appl. No.: 16/864,796

(22) Filed: May 1, 2020

(65) Prior Publication Data

US 2020/0381498 A1 Dec. 3, 2020

(30) Foreign Application Priority Data

May 31, 2019 (KR) .................. 10-2019-0064846

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/323* (2013.01); *H01L 51/5253* (2013.01); *H01L 51/5284* (2013.01)

(58) Field of Classification Search
None
See application file for complete search history.

(56) References Cited

U.S. PATENT DOCUMENTS

| | | | |
|---|---|---|---|
| 2004/0178724 A1* | 9/2004 | Karasawa | H01L 51/5281 313/506 |
| 2015/0194634 A1* | 7/2015 | Kang | H01L 51/5268 257/40 |
| 2019/0027547 A1* | 1/2019 | Kim | H01L 27/3272 |
| 2019/0165068 A1* | 5/2019 | Park | H01L 27/3272 |

* cited by examiner

*Primary Examiner* — Nduka E Ojeh
(74) *Attorney, Agent, or Firm* — Birch, Stewart, Kolasch & Birch, LLP

(57) ABSTRACT

A display apparatus according to the present disclosure can include an anode electrode electrically connected to a thin film transistor disposed on a substrate of the display apparatus, a bank defining an aperture area exposing a portion of the anode electrode, an emission layer disposed on the anode electrode and radiating a light in a specific wavelength band, and a wave absorber disposing at both sides of the aperture area and absorbing the light in the specific wavelength band.

19 Claims, 14 Drawing Sheets

DISPLAY APPARATUS INCLUDING WAVE ABSORBER FOR ABSORBING LIGHT

CROSS-REFERENCE TO RELATED APPLICATIONS

This application claims the priority benefit of the Korean Patent Application No. 10-2019-0064846 filed in the Republic of Korea on May 31, 2019, the entire contents of which is hereby expressly incorporated by reference as if fully set forth herein into the present application.

BACKGROUND

Field of the Invention

The present disclosure relates to a display apparatus.

Discussion of the Related Art

A display apparatus such as a liquid crystal display or an electroluminescent display device is easy to implement high resolution and has various advantages as a large area screen display device.

Such a display apparatus can include a display panel for representing various video images. The display panel can include a plurality of pixels and each of pixels can have a plurality of sub pixels for representing basic or primary colors. For example, one pixel includes a red sub pixel, a green sub pixel and a blue sub pixel.

As the technology for ensuring wide viewing angle is developed, a display device has an enhanced viewing angle. On the contrary, in some cases, it is required to adapt a privacy film for blocking the lights radiating to side directions in order to ensure the security or to resolve the mirror images, which can cause the brightness to decrease. For example, the display according to the related art technologies can have a lower aperture ratio of display panel when blocking the lights emitted to the side direction of the display panel, and thus can lower the brightness or luminance. Accordingly, the display device of the related art can have a problem in that power consumption is increased for compensating the decreased brightness. In addition, as the power consumption is increased, the lifetime of the related art display can be decreased.

SUMMARY

One purpose of the present disclosure, as for solving the problems described above, is to provide a display apparatus in which each of a plurality of pixels has a wave absorber at both sides of aperture area for absorbing the light of specific wavelength band so that the light viewing angle can be controlled and the light transmittance or transmittancy of the display panel is enhanced.

Further, another purpose of the present disclosure is to provide a display apparatus including a wave absorber disposed at the same layer with the bank, so that any additional light control film is not required to control the viewing angle of the display panel, and to prevent the display panel from being thicker due to the additional light control film.

Still another purpose of the present disclosure is to provide a display apparatus including a wave absorber having a thickness in nanometers so that it can control the viewing angle and enhance the aperture ratio and transmittance of the display panel.

Yet another purpose of the present disclosure is to provide a display apparatus for controlling the viewing angle without any additional light control film, by adjusting the area of the aperture area, the height of the wave absorber and the thickness of the wave absorber.

In order to accomplish the above mentioned purposes of the present disclosure, a display apparatus according to the present disclosure can include an anode electrode electrically connected to a thin film transistor disposed on a substrate of the display apparatus; a bank defining an aperture area exposing a portion of the anode electrode; an emission layer for radiating lights of a specific wavelength band; and a wave absorber for absorbing the light in the specific wavelength band.

A display apparatus according to an example of the present disclosure can include a substrate having a display area including a plurality of pixel; a bank disposed on the substrate for defining an aperture area of each of the pixels; emission layer disposed at the aperture area of each pixel for emitting light of respective wavelength bands of a first wavelength band, a second wavelength band and a third wavelength band; and a first wave absorber, a second wave absorber and a third wave absorber disposed at both sides of the aperture area of respective pixels for absorbing lights corresponding to the first wavelength band, the second wavelength band and the third wavelength band, respectively.

The detailed embodiments according other examples will be explained with the corresponding drawings.

The display apparatus according to the present disclosure can control the viewing angle and enhance the transmittance of the display panel, by means of a wave absorber disposed at both sides of the aperture area of each pixel that absorbs the lights in a specific wavelength band.

The display apparatus according to the present disclosure can include a wave absorber disposed on the same layer with the bank, so that any additional light control film is not required for controlling the viewing angle, and the display panel may not be thicker.

The display apparatus according to the present disclosure can include a wave absorber having a thickness in nanometers, so the viewing angle can be easily controlled and the aperture ratio and the transmittance of the display panel can be enhanced.

The display apparatus according to the present disclosure can control the viewing angle without any additional light control film, by adjusting the area of the aperture area, the height of the wave absorber and the thickness of the wave absorber.

In addition to the effects of the present disclosure mentioned above, other features and advantages of the present disclosure can be described below, or can be clearly understood by those skilled persons in this art from such below descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
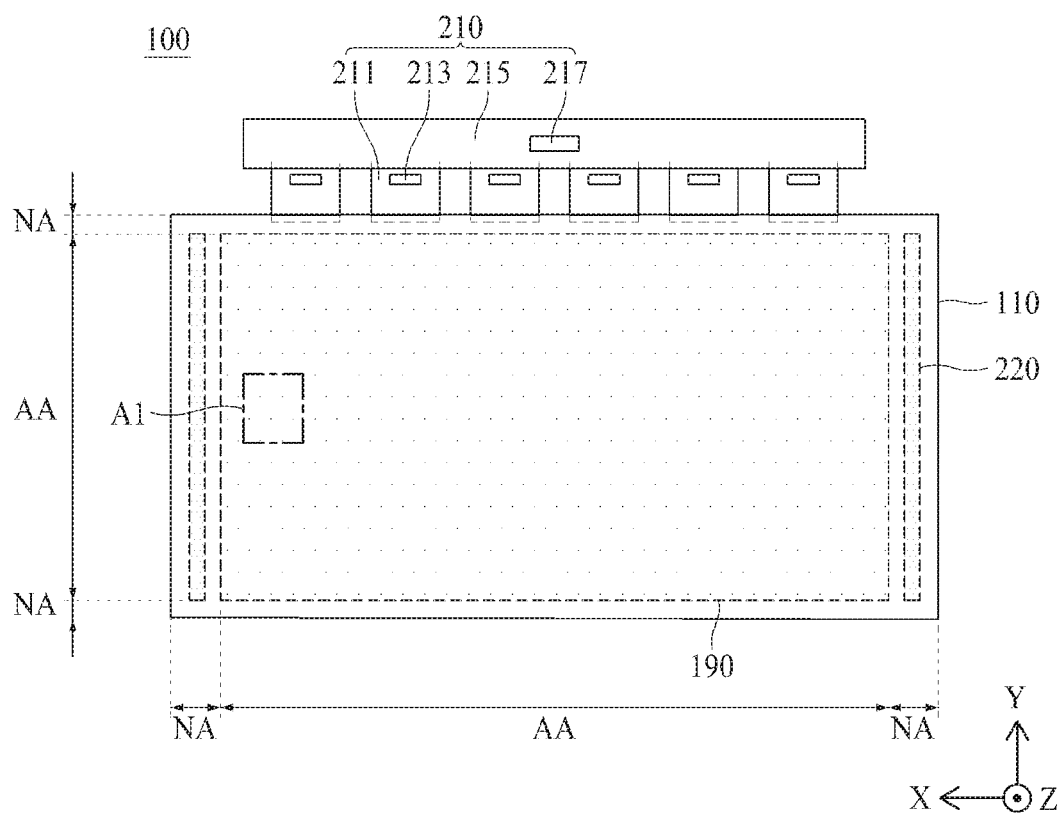
FIG. 1 is a plan view illustrating a display apparatus according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part can also be present unless "only" is used. The terms in a singular form can include plural forms unless noted to the contrary.

In construing an element, the element is construed as including an error range although there is no explicit description.

In describing a positional relationship, for example, when the positional order is described as "on," "above," "below," and "next," the case of no contact there-between can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) can be used. These terms are only to distinguish the elements from other elements, and the terms are not limited in nature, order, sequence or number of the elements. When an element is described as being "linked", "coupled" or "connected" to another element that element can be directly linked, coupled or connected to the other element, and that element can also be indirectly linked, coupled or connected to the other element, unless otherwise specified. It is to be understood that other elements can be "interposed" between each element that can be linked, connected to or coupled to each other.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the accompanying drawings. In designating reference numerals to elements of each drawing, the same components can have the same reference numerals as much as possible even though they are shown in different drawings. Scale of the elements shown in the accompanying drawings have a different scale from the actual for convenience of description, it is not limited to the scale shown in the drawings.

FIG. 1 is a plan view illustrating a display apparatus according to one embodiment of the present disclosure. All the components of the display apparatus according to all embodiments of the present disclosure are operatively coupled and configured.

Referring to FIG. 1, a display apparatus 100 comprises a substrate 110, a pixel array region 190, a driving circuit portion 210 and a scan circuit portion 220.

The substrate 110 includes a display area AA and a non-display area NA. The display area AA, as an area for displaying video image, can be defined in the middle portion of the substrate 110. Here, the display area AA can be corresponding to the active area of the pixel array area 190. For example, the display area AA can include a plurality of pixels (not shown) formed at each pixel area defined by crossing structure of a plurality of gate lines (not shown) and a plurality of data line (not shown). Each of the pixels can include one or more sub pixels and each sub pixel can be defined as the unit area for radiating the light.

The non-display area NA, as the area not representing the video images, can be defined at the circumferential portions of the substrate 110 as surrounding the display area AA. For example, the non-display area NA can include a pad area having at least one pad electrode (not shown).

The pixel array region 190 includes a thin film transistor layer and an emission element layer. The thin film transistor layer can include a thin film transistor, a gate insulating layer, an intermediate insulating layer, a passivation layer and a planarization layer. The emission element layer can include a plurality of emission elements and a plurality of banks. The pixel array region 190 will be explained in detail with FIG. 3.

The driving circuit portion 210 can be connected to the pad electrodes disposed at the non-display area NA of the substrate 110, so as to represent the video images corresponding to the video data supplied from the display driving system to the pad electrode, at each of the pixels. For example, the driving circuit portion 210 can include a plurality of circuit film 211, a plurality of data driving integrated circuit 213, a printed circuit board 215 and a timing controller 217.

The input terminals disposed at one side of each circuit film 211 can be attached to the printed circuit board 215 by the film bonding process, and the output terminals disposed at another side of each circuit film 211 can be attached to the pad area. For example, each circuit films 211 can be made of a flexible circuit film in order to reduce the bezel area of the display apparatus 100. The circuit films 211 can be made of TCP (Tape Carrier Package) or COF (Chip On Flexible Board or Chip On Film).

Each of the plurality of data driving integrated circuits 213 is packaged in the plurality of circuit films 211, respectively. Each of the plurality of data driving integrated circuits 213 receives the pixel data and the data control signal provided from the timing controller 217, converts the pixel data into the analog data signal of each pixel according to the data control signal and then supplies the analog data signal to each of the data line.

The printed circuit board 215 supports the timing controller 217, and transmits the signals and power between the elements of the driving circuit portion 210. The printed circuit board 215 supplies the signals supplied from the timing controller 217 for representing the images on the pixel and the driving power to the plurality of data driving integrated circuit 213 and the scan circuit portion 220. To do so, the signal transmitting lines and power lines can be disposed on the printed circuit board 215. For example, the printed circuit board 215 can be configured to be one or more according to the number of the circuit film 211.

The timing controller 217 is mounted at the printed circuit board 215, and receives the video data and the timing synchronization signal provided from the display driving system through a user connector equipped at the printed circuit board 215. The timing controller 217 generates the video pixel data corresponding to the pixel arraying structure based on the timing synchronization signal, and provides the pixel data to the related data driving integrated circuit 213. The timing controller 217 further generates the data control signal and scan control signal based on the timing synchronization signal, controls the driving timing of each of the data driving integrated circuits 213 using the data control signal, and controls the driving timing of the scan circuit portion 220 using the scan control signal. The scan control signal can be supplied to the scan circuit portion 220 through the first and/or the final flexible circuit film among the plurality of circuit films 211 and the non-display area NA of the substrate 110.

The scan circuit portion 220 can be disposed at the non-display area NA of the substrate 110. The scan circuit portion 220 can generate the scan signal according to the scan control signal provided from the driving circuit portion 210, and can supply the scan signal to the scan lines according to the order of the scan lines. For example, the scan circuit portion 220 can be formed at the non-display area NA of the substrate 110 as forming the thin film transistor disposed within the display area AA.

Figure 2:
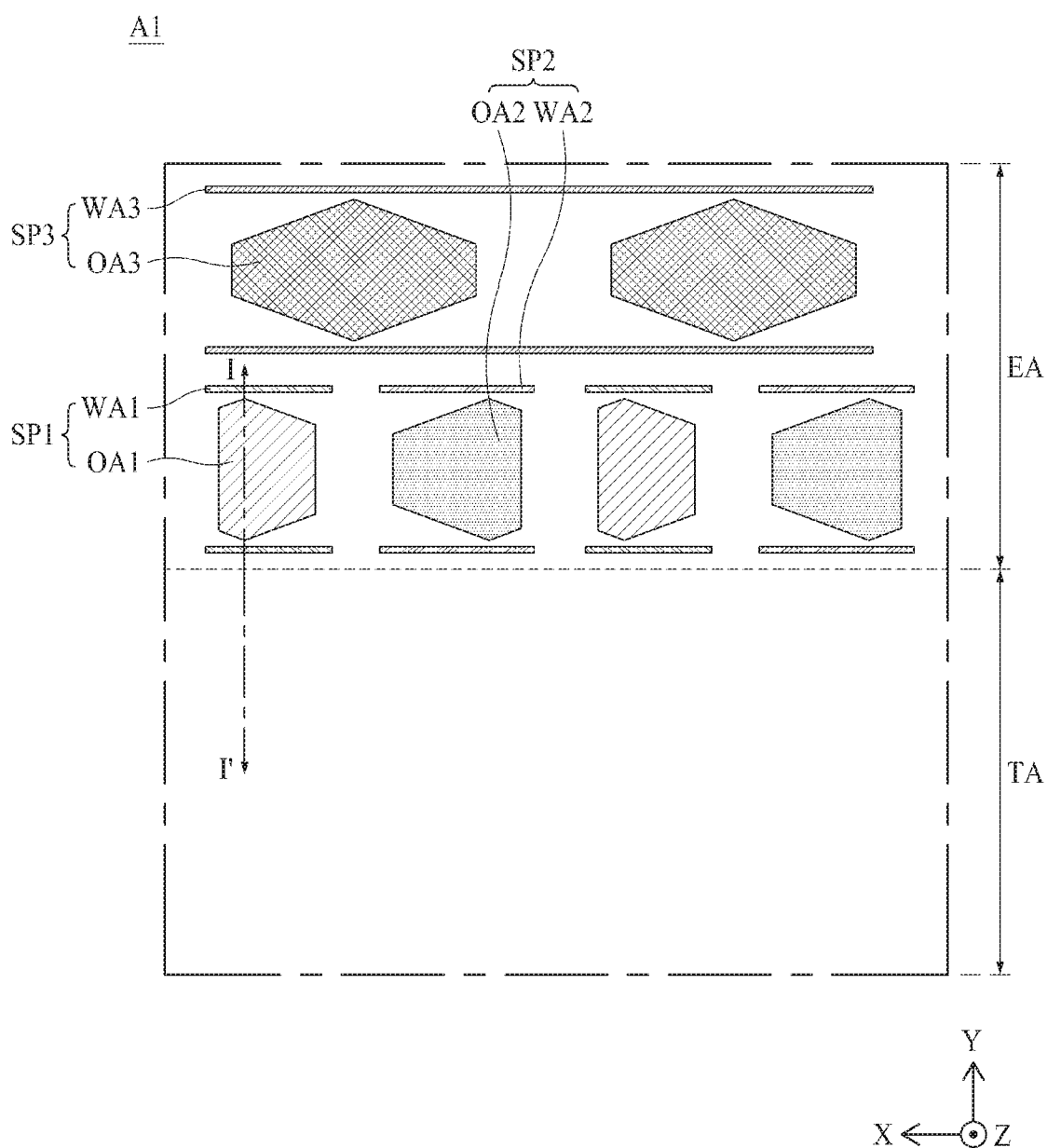
FIG. 2 is an enlarged view of A1 in FIG. 1, for illustrating a display apparatus according to a first embodiment of the present disclosure.

FIG. 2 is an enlarged view of A1 in FIG. 1, for illustrating a display apparatus according to the first embodiment of the present disclosure.

Referring to FIG. 2, the substrate 110 can include an emission area EA in which a plurality of pixels are formed for radiating lights, and a transparent area TA where incident lights are passing through from one side to the opposite side.

The emission area EA can include a plurality of sub pixels, where each of sub pixels can be defined as the unit area for radiating light. For example, the emission area EA can include at least three sub pixels SP1, SP2 and SP3 adjacent to each other. The first sub pixel SP1 can be configured as the red sub pixel radiating the red color light, the second sub pixel SP2 can be configured as the green sub pixel radiating the green color light, and the third sub pixel SP3 can be configured as the blue sub pixel radiating the blue color light. However, it is not necessarily limited to this configuration. Further, the emission area EA can correspond to an opaque area in which incident light is not transmitted but blocked.

Each of these sub pixels SP1, SP2 and SP3 includes a first aperture area OA1, a second aperture area OA2 and a third aperture area OA3, respectively which are defined by the bank. In detail, a plurality of emission layers are disposed at the first aperture area OA1, the second aperture area OA2 and the third aperture area OA3 for radiating lights in a specific wavelength band, respectively. Each size of the first to third aperture areas OA1, OA2 and OA3 can be determined according to the brightness or luminance of the lights radiated from each of the emission layers. When the first to third aperture areas OA1, OA2 and OA3 have the same area, the maximum luminance level of the blue light radiated from the third aperture area OA3 can be lower than the maximum luminance level of the red light radiated from the first aperture area OA1. In order to represent a pure white light after mixing three primary lights, the first to third sub pixels SP1, SP2 and SP3 can have different sizes each other. For example, among these three aperture areas OA1, OA2 and OA3, the third aperture area OA3 can have the smallest area, and the first aperture area OA1 can have the largest area, but it is not limited thereto. Each size of these three aperture areas OA1, OA2 and OA3 can be adjusted so as to implement a pure white light by mixing the lights radiated from the first sub pixel SP1, the second sub pixel SP2 and the third sub pixel SP3.

The emission area EA can include a wave absorber absorbing lights in a specific wavelength band. The first sub pixel SP1 has a first wave absorber WA1 disposed at both opposite sides of the first aperture area OA1 for absorbing lights in a specific wavelength band corresponding to the emission layer disposed within the first aperture area OA1. The second sub pixel SP2 has a second wave absorber WA2 disposed at both opposite sides of the second aperture area OA2 for absorbing lights in a specific wavelength band corresponding to the emission layer disposed within the second aperture area OA2. The third sub pixel SP3 has a third wave absorber WA3 disposed at both opposite sides of the third aperture area OA3 for absorbing lights in a specific wavelength band corresponding to the emission layer disposed within the third aperture area OA3.

The first wave absorber WA1 can be disposed at both sides of the first aperture area OA1 of the first sub pixel SP1 as being parallel each other for absorbing the light in the first wavelength band. For example, the first wavelength band can correspond to the range of 620 nm to 780 nm. The light corresponding to the first wavelength band can be the red light.

The second wave absorber WA2 can be disposed at both sides of the second aperture area OA2 of the second sub pixel SP2 as being parallel each other for absorbing the light in the second wavelength band. For example, the second wavelength band can correspond to the range of 495 nm to 570 nm. The light corresponding to the second wavelength band can be the green light.

The third wave absorber WA3 can be disposed at both sides of the third aperture area OA3 of the third sub pixel SP3 as being parallel each other for absorbing the light in the third wavelength band. For example, the third wavelength band can correspond to the range of 450 nm to 495 nm. The light corresponding to the third wavelength band can be the blue light.

For one example, the display apparatus can further include a first color filter, a second color filter and a third color filter (not shown) respectively at least partially overlapped with the first aperture area OA1, the second aperture area OA2 and the third aperture area OA3. Here, the first to third wave absorbers WA1, WA2 and WA3 are disposed as corresponding to both sides of each of the first to third color filters.

In one example, each of the wave absorbers WA1, WA2 and WA3 can be extended along the first horizontal direction (X-axis), and a pair of wave absorbers WA1, a pair of wave absorbers WA2 and a pair of wave absorbers WA3 can be separated from each other with a distance corresponding to the lengths of respective aperture areas OA1, OA2 and OA3 along the second horizontal direction (Y-axis) respectively, in the second horizontal direction (Y-axis). As each of the wave absorbers WA1, WA2 and WA3 is disposed at upper side and lower side of respective aperture areas OA1, OA2 and OA3, the side viewing angle of the display apparatus 100 in the second horizontal direction (Y-axis) can be controlled. Accordingly, the display apparatus according to the present disclosure can enhance the security in the second horizontal direction or improve the image reflection phenomenon (or mirroring phenomenon) in the second horizontal direction.

In another example, each of the wave absorbers WA1, WA2 and WA3 can be extended along the second horizontal direction (Y-axis), and a pair of first wave absorbers WA1, a pair of second wave absorbers WA2 and a pair of third wave absorbers WA3 can be separated from each other with a distance corresponding to the widths of respective aperture areas OA1, OA2 and OA3 along the first horizontal direction (X-axis), respectively in the first horizontal direction (X-axis). As each of the wave absorbers WA1, WA2 and WA3 is disposed at left side and right side of respective aperture areas OA1, OA2 and OA3, the side viewing angle of the display apparatus 100 in the first horizontal direction (X-axis) can be controlled. Accordingly, the display apparatus according to the present disclosure can enhance the security in the first horizontal direction or improve the image reflection phenomenon (or mirroring phenomenon) in the first horizontal direction.

In some cases, each of the aperture areas OA1, OA2 and OA3 can be formed as a polygon or circle, and have different shapes and areas. For example, each of aperture areas OA1, OA2 and OA3 can be formed as a hexagonal shape, but it is not limited thereto. The first horizontal direction (X-axis) width of each of the wave absorbers WA1, WA2 and WA3 can be proportional to the first horizontal direction (X-axis) width of respective aperture areas OA1, OA2 and OA3, respectively.

In one example, a plurality of third aperture areas OA3 can be arrayed along the first row in a plane including a first horizontal line (X-axis) and a second horizontal line (Y-axis), and the third wave absorber WA3 can be disposed at the upper side and the lower side of the plurality of third aperture areas OA3 as extending along the first horizontal direction (X-axis). A plurality of the first aperture areas OA1 and a plurality of the second aperture areas OA2 can be alternately arrayed along the second row. Accordingly, each of the first and second wave absorbers WA1 and WA2 can be disposed at the upper-lower sides of respective first and second aperture areas OA1 and OA2 as being alternately arrayed along the first horizontal direction (X-axis).

The transparent area TA is the non-opaque area where all incident lights pass through. Therefore, through the transparent area TA, the user can see an object or a background located at the rear of the display apparatus 100. In addition, by the lights radiated from the emission area EA, the user can observe the video images, at the same time.

Figure 3:
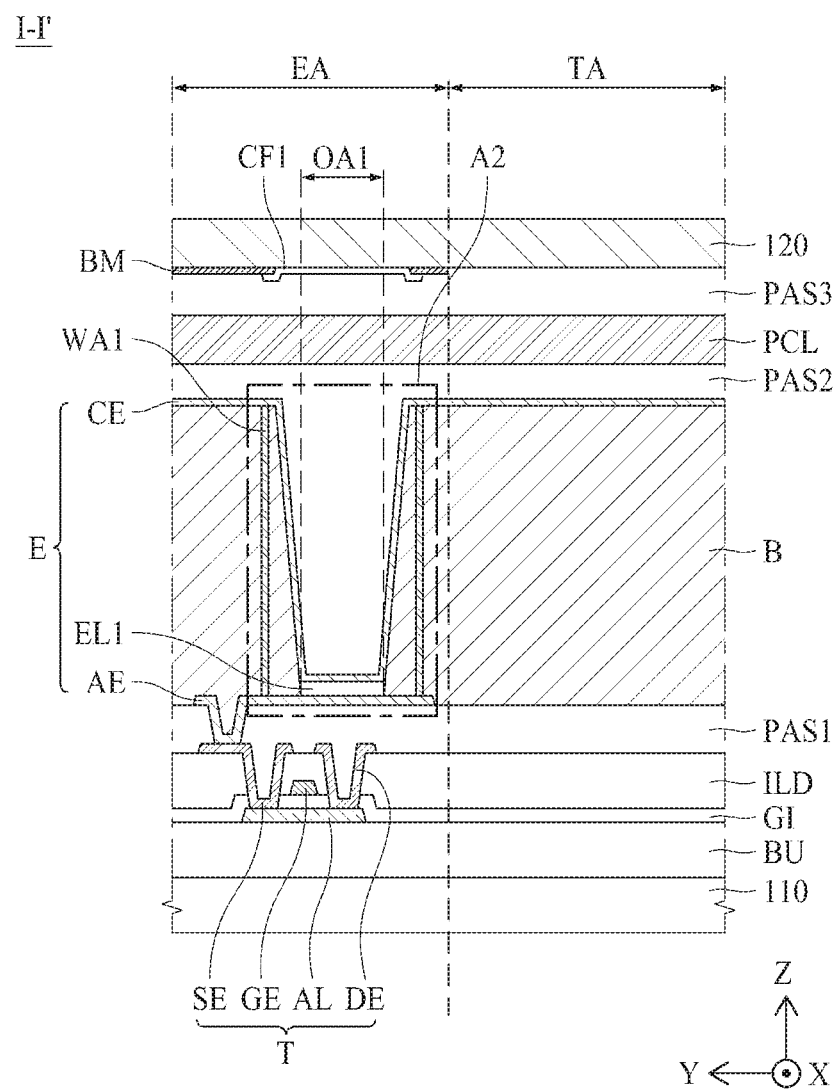
FIG. 3 is a cross-sectional view along the line I-I' in FIG. 2.

FIG. 3 is a cross-sectional view along the line I-I' in FIG. 2.

Referring to FIG. 3, the display apparatus 100 can comprise a substrate 110, a buffer layer BU, a gate insulating layer GI, an intermediate insulating layer ILD, a thin film transistor T, a planarization layer PAS1, an emission element E, a bank B, a first wave absorber WA1, a first encapsulation layer PAS2, a second encapsulation layer PCL, a third encapsulation layer PAS3, a first color filter CF1, a black matrix BM and an upper substrate 120.

The substrate 110, as a base substrate, can be a flexible substrate. For example, the substrate 110 can be made of a transparent polyimide material. Considering the depositing process under high temperature environment, the polyimide substrate 110 can include a polyimide material having excellent thermal resistance property. The polyimide substrate 110 can be formed by hardening the polyimide resin after coating to a certain thickness over the front surface of the sacrificial layer provided over the carrier glass substrate. Here, the carrier glass substrate can be separated from the polyimide substrate 110 by the releasing process of the sacrificial layer using a laser release process. The sacrificial layer can be made of an amorphous silicon (a-Si) layer or a silicon nitride (SiNx) layer.

In one example, the substrate 110 can be a glass substrate. For example, the substrate 110 can include silicon oxide (SiO2) material or oxide aluminum (Al2O3) material as a primary component.

The buffer layer BU can be disposed on the substrate 110. In one example, the buffer layer BU can include a plurality of inorganic layers sequentially stacked. For example, the buffer layer BU can be formed of the multiple layers including one or more inorganic layers of silicon oxide (SiOx) material, silicon nitride (SiNx) material and silicon oxynitride (SiON) material. The buffer layer BU can be formed on the upper whole surface of the substrate 110 in order to prevent the moisture and/or foreign materials intruded into the emission element. Accordingly, by including a plurality of inorganic layers, the buffer layer BU can decrease the water vapor transmission rate (WVTR) of the display panel.

The thin film transistor T can be disposed in the display area AA on the substrate 110. The thin film transistor T can include a semiconductor layer AL, a gate electrode GE, a drain electrode DE and a source electrode SE.

The semiconductor layer AL can be disposed in the display area AA on the substrate 110. The semiconductor layer AL can be disposed as at least partially overlapped with the gate electrode GE, the drain electrode DE and the source electrode SE. The semiconductor layer AL can be directly contact to the drain electrode DE and the source electrode SE, and at least partially overlapped with the gate electrode GE with the gate insulating layer GI therebetween.

The gate insulating layer GI can be disposed on the semiconductor layer AL. For example, the gate insulating layer GI can be disposed over the semiconductor layer AL and the buffer layer BU to electrically isolate the semiconductor layer AL from the gate electrode GE. For example, the gate insulating layer GI can include a first contact hole for connecting to the drain electrode DE and a second contact hole for connecting to the source electrode SE.

The gate electrode GE can be formed on the gate insulating layer GI. The gate electrode GE can be at least partially overlapped with the semiconductor layer AL having the gate insulating layer GI therebetween.

The intermediate insulating layer ILD can be disposed over the gate electrode GE. For example, the intermediate insulating layer ILD can include a first contact hole through which the drain electrode DE passes and a second contact hole through which the source electrode SE passes. Here, the first contact hole and the second contact hole of the intermediate insulating layer ILD can be linked to the first contact hole and the second contact hole of the gate insulating layer GI, respectively.

The drain electrode DE and the source electrode SE can be disposed on the intermediate insulating layer ILD as being separated from each other. The drain electrode DE can contact one end of the semiconductor layer AL through the first contact holes formed at the gate insulating layer GI and the intermediate insulating layer ILD, and the source electrode SE can contact the other end of the semiconductor layer AL through the second contact holes formed at the gate insulating layer GI and the intermediate insulating layer ILD. The source electrode SE can be directly contact the anode electrode AE of the emission element E through a third contact hole formed at the planarization layer PAS1.

The planarization layer PAS1 can be disposed over the thin film transistor T so as to make the upper surface over the thin film transistor be in plan condition. For example, the planarization layer PAS1 can include the third contact hole through which the anode electrode AE passes.

The emission element E can be disposed on the planarization layer PAS1, and electrically connected to the thin film transistor T. The emission element E can include an anode electrode AE, a first emission layer EL1 and a cathode electrode CE. The first emission layer EL1 can include an organic light emitting layer or an inorganic light emitting layer, or can be formed as a micro emitting diode.

The anode electrode AE can be disposed on the planarization layer PAS1. For example, the anode electrode AE can be disposed as at least partially overlapping with the first aperture area OA1 of the emission element E defined by the bank B. The anode electrode AE can be contact the source electrode SE of the thin film transistor T through the third contact hole formed at the planarization layer PAS1. In one example, the anode electrode AE can be made of a reflective material.

The first emission layer EL1 can be disposed on the anode electrode AE for radiating light in a specific wavelength band. For example, the first emission layer EL1 can be disposed at the first aperture area OA1 of the first sub pixel SP1, and configured to radiate light in a first wavelength band, wherein the first wavelength band can correspond to the red light. For example, the first wavelength band can be corresponding to the range of 620 nm to 780 nm, but it is not limited thereto.

In one example, the first emission layer EL1 can include a hole injection layer (HIL), a hole transport layer (HTL), an emitting layer (EML), an electron transport layer (ETL) and an electron injection layer (EIL) (not shown). For example, the hole injection layer (HIL), the hole transport layer, the emitting layer (EML), the electron transport layer (ETL) and the electron injection layer (EIL) can be sequentially stacked between the anode electrode AE and the cathode electrode CE. Here, the hole injection layer (HIL) and the hole transport layer (HTL) may not be divided by per pixel but be commonly disposed over the whole pixels. The emitting layer (EML) can be disposed within the first aperture area OA1 of the first sub pixel SP1 after depositing the hole injection layer (HIL) and the hole transport layer (HTL). The electron transport layer (ETL) and the electron injection layer (EIL) can be commonly disposed over the whole pixels, not divided by per pixel, after forming the emitting layer (EML). The emitting layer (EML) of the first emission layer EL1 is disposed at the first aperture area OA1 and radiates the light in the first wavelength band. The hole injection layer (HIL), the hole transport layer (HTL), the electron transport layer (ETL) and the electron injection layer (EIL) can be disposed between the cathode electrode CE and the bank B at the area where the hole injection layer (HIL), the hole transport layer (HTL), the electron transport layer (ETL) and the electron injection layer (EIL) are not overlapped with the first aperture area OA1.

In one example, the hole injection layer (HIL), the hole transport layer (HTL), the electron transport layer (ETL) and the electron injection layer (EIL) can cover the first wave absorber WA1. In detail, the hole injection layer (HIL), the hole transport layer (HTL), the electron transport layer (ETL) and the electron injection layer (EIL) can be disposed between the first wave absorber WA1 and the cathode electrode CE or between the bank B and the cathode electrode CE at the area where the hole injection layer (HIL), the hole transport layer (HTL), the electron transport layer (ETL) and the electron injection layer (EIL) are not overlapped with the first aperture area OA1.

The cathode electrode CE can be disposed on the first emission layer EL1 and the bank B. In one example, the cathode electrode CE is not divided per pixel area, but can be made as one sheet electrode commonly deposited over the whole pixels. For example, as the voltage difference is applied between the anode electrode AE and the cathode electrode CE, the holes and the electrons can move to the first emission layer EL1 through the hole transport layer HTL and the electron transport layer ETL, respectively. Then, the holes and electrons are combined at the first emission layer EL1 to radiate lights. The cathode electrode CE can be made of a transparent conductive material and play the role of cathode in the emission element E.

The bank B can be disposed on the planarization layer PAS1 as overlaying the circumferences of the anode electrode AE to define the aperture areas OA1, OA2 and OA3 of respective sub pixels SP1, SP2 and SP3. For example, the bank B can be disposed between the neighboring two anode electrodes AE, and expose major middle portions of the anode electrode AE through the first aperture area OA1. By electrically insulating the neighboring anode electrodes, the bank B can define each of the aperture areas OA1, OA2 and OA3 of respective sub pixels SP1, SP2 and SP3.

The first wave absorber WA1 can be disposed at both sides of the first aperture area OA1 of the first sub pixel SP1, and absorb the light in the first wavelength band. In one example, the first emission layer EL1 disposed at the first aperture area OA1 can radiate the light in the first wavelength band, and the first wave absorber WA1 can absorb the light in the first wavelength band. In detail, the light in the first wavelength band propagating to the vertical direction (Z-axis) can pass through the first color filter CF1 and go to the front side of the display apparatus 100. Some amounts of the light in the first wavelength band propagating to the diagonal direction between the second horizontal direction (Y-axis) and the vertical direction (Z-axis) can be absorbed by the first wave absorber WA1. In other words, when the first wave absorber WA1 is disposed at the upper side and the lower side of the first aperture area OA1 in the XY plane, the first wave absorber WA1 can prevent the light in the first wavelength band from going to the upper and lower sides of the display apparatus 100 so that the viewing angle of the display apparatus 100 can be controlled.

The side vertical surfaces of the first wave absorber WA1 can be covered or surrounded by the bank B. In detail, the bank B can be formed by depositing an organic material or resin material on the anode electrode AE and the planarization layer PAS1, and removing the portions at the areas corresponding to the first wave absorber WA1 and the first aperture area OA1 for the first emission layer ELL The area for the first wave absorber WA1 can be patterned by removing the organic material (or resin) of bank B using the photo resist process and the wet etching process. Here, the area for the first wave absorber WA1 can correspond to the removed groove portion formed at the bank B by the photo resist process and the wet etching process. The first wave absorber WA1 can be formed by depositing and hardening an organic material having the property of absorbing the light in the first wavelength band within the groove portion formed at the bank B. Accordingly, all side surfaces of the first wave absorber WA1 can be surrounded by the bank B. The first wave absorber WA1 can be disposed between the anode electrode AE and the cathode electrode CE or between the planarization layer PAS1 and the cathode electrode CE. The lower surface of the first wave absorber WA1 can contact the anode electrode AE or the planarization layer PAS1, and the upper surface of the first wave absorber WA1 can contact the cathode electrode CE.

However, the method for manufacturing the first wave absorber WA1 is not limited to the above mentioned process. The first wave absorber WA1 can be formed as being disposed at both sides of the first aperture area OA1 by other manufacturing processes.

The first encapsulation layer PAS2 can cover the emission element E. In detail, the first encapsulation layer PAS2 can be disposed as covering upper whole surface of the cathode electrode CE. For example, the first encapsulation layer PAS2 can include any one inorganic layer made of silicon oxide (SiOx), silicon nitride (SiNx) and silicon oxynitride (SiON).

The second encapsulation layer PCL can overlay the first encapsulation layer PAS2. For example, the second encapsulation layer PCL can include at least one organic layer made of acryl resin, epoxy resin, phenolic resin, polyamides resin and polyimides resin. The second encapsulation layer PCL can be formed on the first encapsulation layer PAS2 using a low temperature process to protect the first encapsulation layer PAS2 and the emission element E.

The third encapsulation layer PAS3 can cover the second encapsulation layer PCL. For example, the third encapsulation layer PAS3 can include any one inorganic layer made of silicon oxide (SiOx), silicon nitride (SiNx) and silicon oxynitride (SiON). By protecting the foreign materials including moisture, the first to third encapsulation layers PAS2, PCL and PAS3 can prevent the emission element E from being degraded.

The first color filter CF1 can be disposed over one surface of the upper substrate 120 facing with the substrate 110, and can correspond to the first aperture area OA1 of the first sub pixel SP1. For example, the first color filter CF1 can be surrounded by the black matrix BM patterned on one surface of the upper substrate 120. Corresponding to the first emission layer EL1 of the emission element E, the first color filter CF1 can transmit the light in the first wavelength band. As the first color filter CF1 is disposed as at least partially overlapping with the first aperture area OA1, the first wave absorber WA1 can be disposed as being parallel at both sides of the first color filter CF1. For example, the first color filter CF1 can correspond to the red color filter. Accordingly, the first sub pixel SP1 can pass the red light radiated from the first emission layer EL1 to the front direction of the display apparatus 100, through the first color filter CF1.

The black matrix BM can be formed on one surface of the upper substrate 120 facing the substrate 110. In detail, as being disposed between every two neighboring color filters, the black matrix BM can partition each of the plurality of color filters. The black matrix BM can surround the first aperture area OA1 of the emission element E, and block the lights incident into the thin film transistor T.

Figure 4:
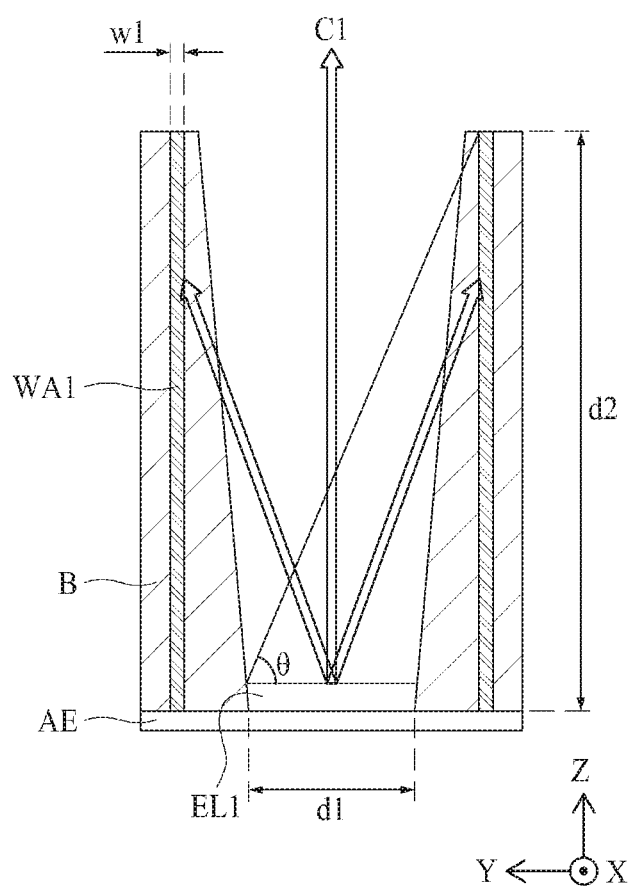
FIG. 4 is an enlarged view of A2 in FIG. 3, for illustrating the control of a viewing angle in a first sub pixel.
Figure 5:
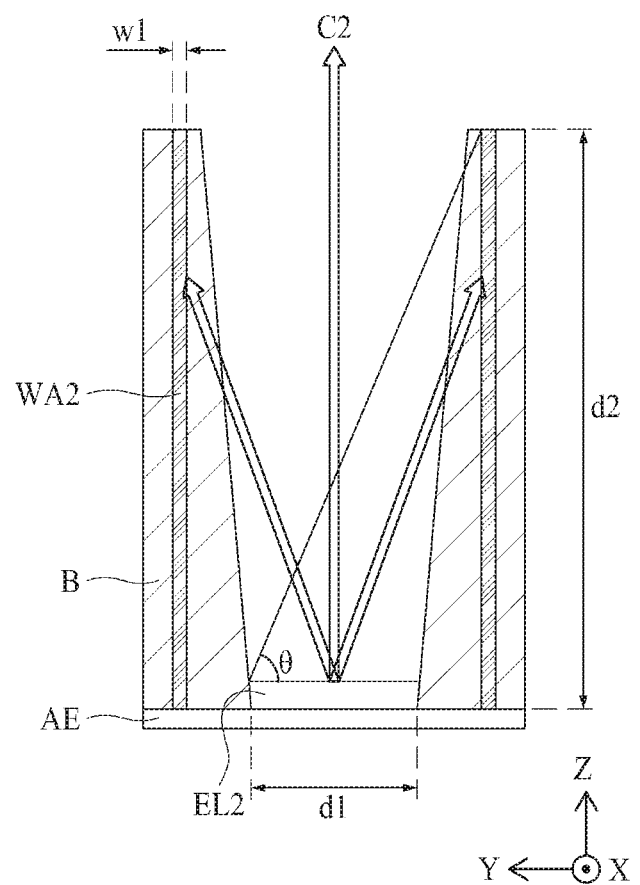
FIG. 5 is a diagram illustrating the control of a viewing angle in a second sub pixel of the display apparatus shown in FIG. 2.
Figure 6:
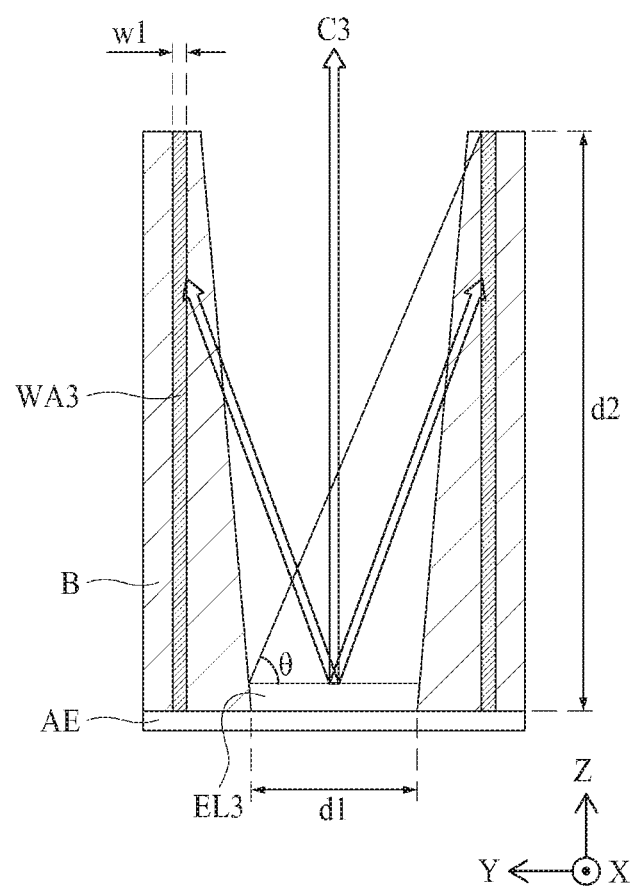
FIG. 6 is a diagram illustrating the control of a viewing angle in a third sub pixel of the display apparatus shown in FIG. 2.

FIG. 4 is an enlarged view of A2 in FIG. 3, for illustrating the control of a viewing angle in the first sub pixel. FIG. 5 is a diagram illustrating the control of a viewing angle in the second sub pixel of the display apparatus shown in FIG. 2. FIG. 6 is a diagram illustrating the control of a viewing angle in the third sub pixel of the display apparatus shown in FIG.

2. We will explain mainly about the first emission layer EL1, the first aperture areas OA1 and the first wave absorbers WA1 by focusing on the structure of the first sub pixel SP1. The structures of the second sub pixel SP2 and the third sub pixel SP3 will be briefly explained with minimal redundancy.

Referring to FIG. 4, the first wave absorber WA1 can be disposed at both sides of the first aperture area OA1 of the first sub pixel SP1, and absorb the light in the first wavelength band (or 'the first band light') radiated from the first emission layer ELL For example, the first band light C1 can correspond to the red light.

Referring to FIG. 5, the second wave absorber WA2 can be disposed at both sides of the second aperture area OA2 of the second sub pixel SP2, and absorb the light in the second wavelength band (or 'the second band light') radiated from the second emission layer EL2. For example, the second band light C2 can correspond to the green light.

Referring to FIG. 6, the third wave absorber WA3 can be disposed at both sides of the third aperture area OA3 of the third sub pixel SP3, and absorb the light in the third wavelength band (or 'the third band light') radiated from the third emission layer EL3. For example, the third band light C3 can correspond to the blue light.

In one example, the vertical length (height) d2 along the Z-axis of the first wave absorber WA1 can be 3 times to 4 times of the maximum horizontal length d1 along the second horizontal direction (Y-axis) of the first aperture area OA1. In the case that the ratio of the horizontal length d1 along the second horizontal direction (Y-axis) of the first aperture area OA1 to the vertical length (height) d2 along the vertical direction (Z-axis) of the first wave absorber WA1 is 1:3.5, the first wave absorber WA1 can absorb the first band light C1 propagating between the second horizontal direction (Y-axis) and the vertical direction (Z-axis) so that the viewing angle can be effectively controlled or adjusted to have narrow viewing angle, without any additional light control film upon the display apparatus 100.

In one example, the angle, θ, between the second horizontal line along Y-axis and the line from one end of the first emission layer EL1 to the upper end of the first wave absorber WA1 disposed at the opposite end of the first emission layer EL1 can be one of 70° to 80°. In the case that the angle θ between the line from one end of the first emission layer EL1 to the upper end of the first wave absorber WA1 disposed at the opposite end of the first emission layer EL1 and the second horizontal line along Y-axis is 74°, the first wave absorber WA1 can absorb the first band light C1 propagating to the direction between the second horizontal direction (Y-axis) and the vertical direction (Z-axis) so that the viewing angle can be effectively controlled or adjusted to have narrow viewing angle, without any additional light control film upon the display apparatus 100.

In one example, the thickness w1 of the first wave absorber WA1 can be 1 μm (micrometer) or less. As having a thickness of tens of nanometers, the first wave absorber WA1 enhance the aperture ratio or transparency (or transmittance) of the display apparatus 100 while controlling the viewing angle of the display apparatus 100. When the conventional light control film has a light blocking pattern of micrometers thickness, as the light blocking pattern has the light absorbing material (i.e., black resin), the aperture ratio and/or the transparency of display apparatus 100 can be reduced. To solve these problem, the display apparatus 100 according to the present disclosure can include the first wave absorber WA1 having a thickness of 1 μm (micrometer) or less to enhance the aperture ratio and transparency of the display apparatus 100 than the conventional light control film.

For example, the first wave absorber WA1 can include a material for absorbing the first band light C1 and transmitting the lights in the second wavelength band and the third wavelength band. In the case that the light in the first wavelength band is red light, the light in the second wavelength band is green light and the third light in the third wavelength band is blue light, the first wave absorber WA1 can absorb the red light, and transmit the green light and the blue light. When a light absorber having black resin of 1 μm thickness or less is disposed at both sides of the first aperture area OA1, this light absorber can absorb the lights in all wavelength band, but the light absorption ratio for the light in the first wavelength band can be lower than that of the first wave absorber WA1 according to the present disclosure. As the first wave absorber WA1 includes the material for absorbing the light in the first wavelength band, the absorption ratio of light in the first wavelength band can be increased or enhanced.

Each of the first wave absorber WA1, the second wave absorber WA2 and the third wave absorber WA3 according to the present disclosure includes materials absorbing the first band light C1, the second band light C2 and the third band light C3, respectively. Therefore, the aperture ratio and the transparency of the display apparatus 100 can be enhanced and the absorption ratio for the corresponding band lights C1, C2 and C3 can be improved much more than the display apparatus having the conventional light control film, so that the viewing angle can be effectively controlled.

In the display apparatus 100 according to the first embodiment of the present disclosure, the shape of the first wave absorber WA1 can be defined regardless of the shape of the aperture area OA1 by defining the area for disposing the first wave absorber WA1 separately from the first aperture area OA1 when forming the bank B. For example, the first wave absorber WA1 can be accommodated in a groove formed at the bank B as parting from the first aperture area OA1, so that when the first aperture area OA1 has a hexagonal shape, the first wave absorber WA1 can be extended as a straight line along the first horizontal direction (X-axis), as shown in FIG. 2. The display apparatus according to the present disclosure can effectively control and/or adjust the viewing angle without any additional light control film.

Figure 7:
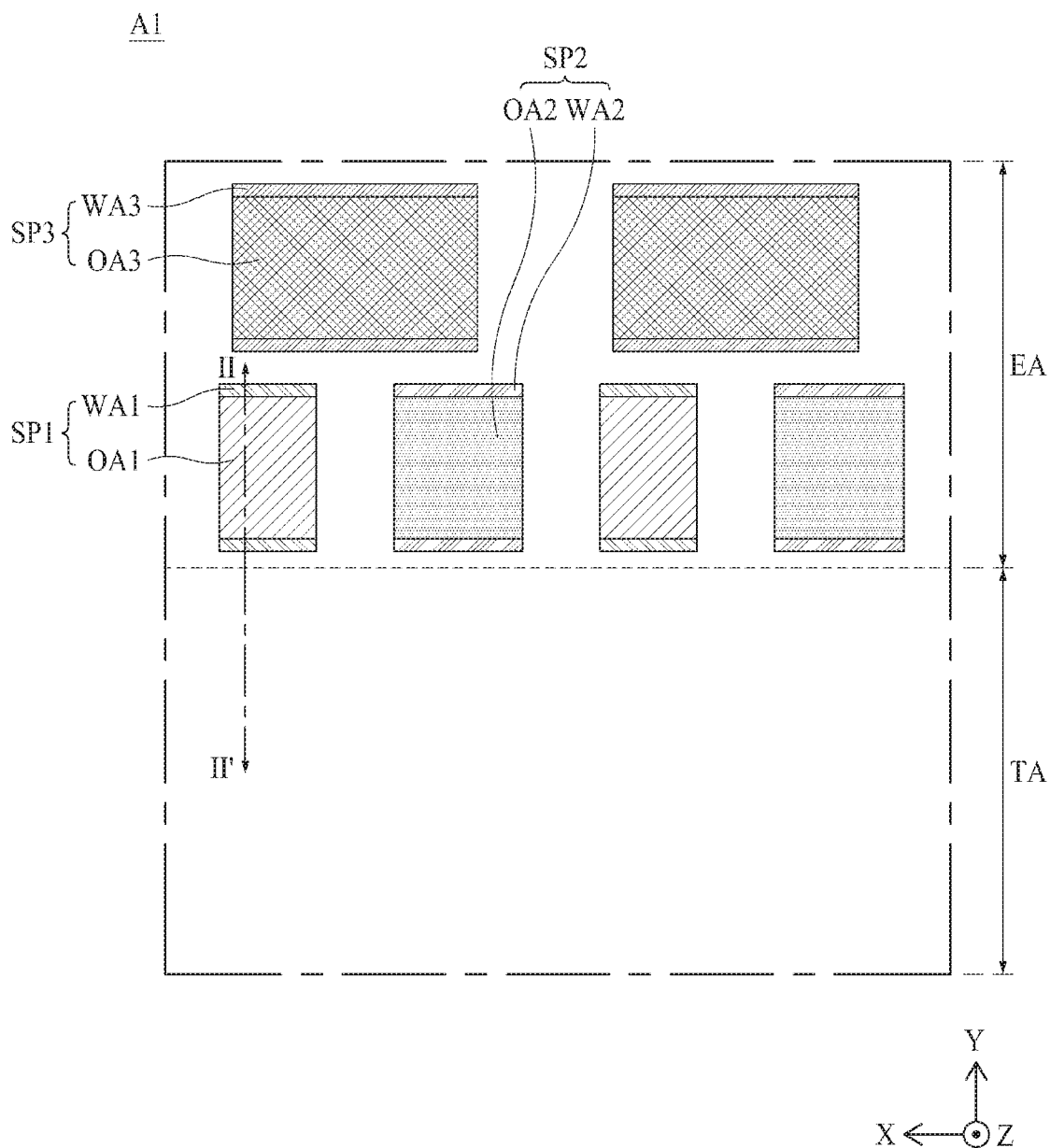
FIG. 7 is an enlarged plane view of A1 in FIG. 1, illustrating a display apparatus according to a second embodiment of the present disclosure.

FIG. 7 is an enlarged plane view of A1 in FIG. 1, illustrating a display apparatus according to the second embodiment of the present disclosure. Hereinafter, the same or similar elements or configurations with those shown in FIG. 2 will be omitted or briefly described.

Referring to FIG. 7, the substrate 110 can include an emission area EA having a plurality of pixels for radiating lights and a transparent area TA for passing through lights.

In one example, the emission area EA can include at least three sub pixels SP1, SP2 and SP3 consecutively disposed next to each other. In detail, the first sub pixel SP1 can correspond to a red sub pixel radiating red light, the second sub pixel SP2 can correspond to a green sub pixel radiating green light and the third sub pixel SP3 can correspond to a blue sub pixel radiating blue light.

The first sub pixel SP1, the second sub pixel SP2 and the third sub pixel SP3 can include the first aperture area OA1, the second aperture area OA2 and the third aperture area OA3, respectively, defined by bank B. In detail, the first emission layer EL1, the second emission layer EL2 and the third emission layer EL3 disposed at the first aperture area OA1, the second aperture area OA2 and the third aperture area OA3, respectively, can radiate light in a specific wavelength band. Each size of the aperture areas OA1, OA2 and OA3 can be different each other according to the luminance of the light radiated from each of emission layers EL1, EL2 and EL3. When three aperture areas OA1, OA2 and OA3 have the same area, the maximum luminance level of the blue light radiated from the third aperture area OA3 can be lower than the maximum luminance level of the red light radiated from the first aperture area OA1. In order to implement pure white light, each of the first to third sub pixels SP1, SP2 and SP3 can have different sized aperture areas from each other. For example, among three aperture areas OA1, OA2 and OA3, the third aperture area OA3 can have the largest area and the first aperture area OA1 can have the smallest area, but it is not limited thereto. The sizes of the first to third aperture areas OA1, OA2 and OA3 can be adjusted to implement pure white light after mixing three primary lights radiated from the first to third sub pixels SP1, SP2 and SP3.

The emission area EA can include the wave absorber disposed at both sides of the aperture area for absorbing the light in a specific wavelength band. Each of the first to third sub pixels SP1, SP2 and SP3 can include the first to third wave absorber WA1, WA2 and WA3, respectively, parallelly disposed at both sides of the first to third aperture areas OA1, OA2 and OA3 for absorbing lights in the specific wavelength band.

As being located at both sides of the first aperture area OA1 of the first sub pixel SP1, the first wave absorber WA1 can absorb light in the first wavelength band. For example, the first wavelength band can correspond to 620 nm to 780 nm. That is, the first wavelength band can correspond to red light.

As being located at both sides of the second aperture area OA2 of the second sub pixel SP2, the second wave absorber WA2 can absorb light in the second wavelength band. For example, the second wavelength band can correspond to 495 nm to 570 nm. That is, the second wavelength band can correspond to green light.

As being located at both sides of the third aperture area OA3 of the third sub pixel SP3, the third wave absorber WA3 can absorb light in the third wavelength band. For example, the third wavelength band can correspond to 450 nm to 495 nm. That is, the third wavelength band can correspond to blue light.

In one example, each of the first to third wave absorbers WA1, WA2 and WA3 can be extended along the first horizontal direction (X-axis) at both sides of the first to third aperture areas OA1, OA2 and OA3, respectively. As the first to third wave absorbers WA1, WA2 and WA3 are disposed at the upper side and the lower side of the first to third aperture areas OA1, OA2 and OA3, respectively, the side viewing angle for the Y-axis direction of the display apparatus 100 can be controlled. The display apparatus according to the present disclosure can have the enhanced optical properties in which the privacy security for Y-axis direction can be improved and the image reflecting problem in the Y-axis direction can be prevented.

In one example, each of the first to third aperture areas OA1, OA2 and OA3 can have a polygon shape or a circle shape, and respective aperture areas can have different shapes and sizes, respectively. In detail, each of the first to third aperture areas OA1, OA2 and OA3 can have the rectangular shape, but it is not restricted thereto. Each first horizontal width along X-axis of the first to third wave absorber WA1, WA2 and WA3 can be proportional to the first horizontal width along X-axis of the first to third aperture areas OA1, OA2 and OA3, respectively.

In one example, a plurality of the third aperture areas OA3 can be arrayed in the first row in the plane consisting of the first horizontal direction (X-axis) and the second horizontal direction (Y-axis). The third wave absorber WA3 can be disposed at upper side and lower side of the plurality of the third aperture areas OA3 as being extended along the first horizontal direction (X-axis). In the interim, a plurality of the first aperture areas OA1 and a plurality of the second aperture areas OA2 can be alternately arrayed in the second row along the first horizontal direction (X-axis). Each of the first and second wave absorbers WA1 and WA2 can be disposed at upper side and lower side of the first and second aperture areas OA1 and OA2, respectively, as being extended along the first horizontal direction (X-axis).

The transparent area TA can correspond to an area where lights are passing through from one side to opposite side. Therefore, user can see or recognize the objects and/or background view located behind the display apparatus 100 through the transparent area TA. In addition, user can see the video images from the lights radiated from the emission area EA, at the same time.

Figure 8:
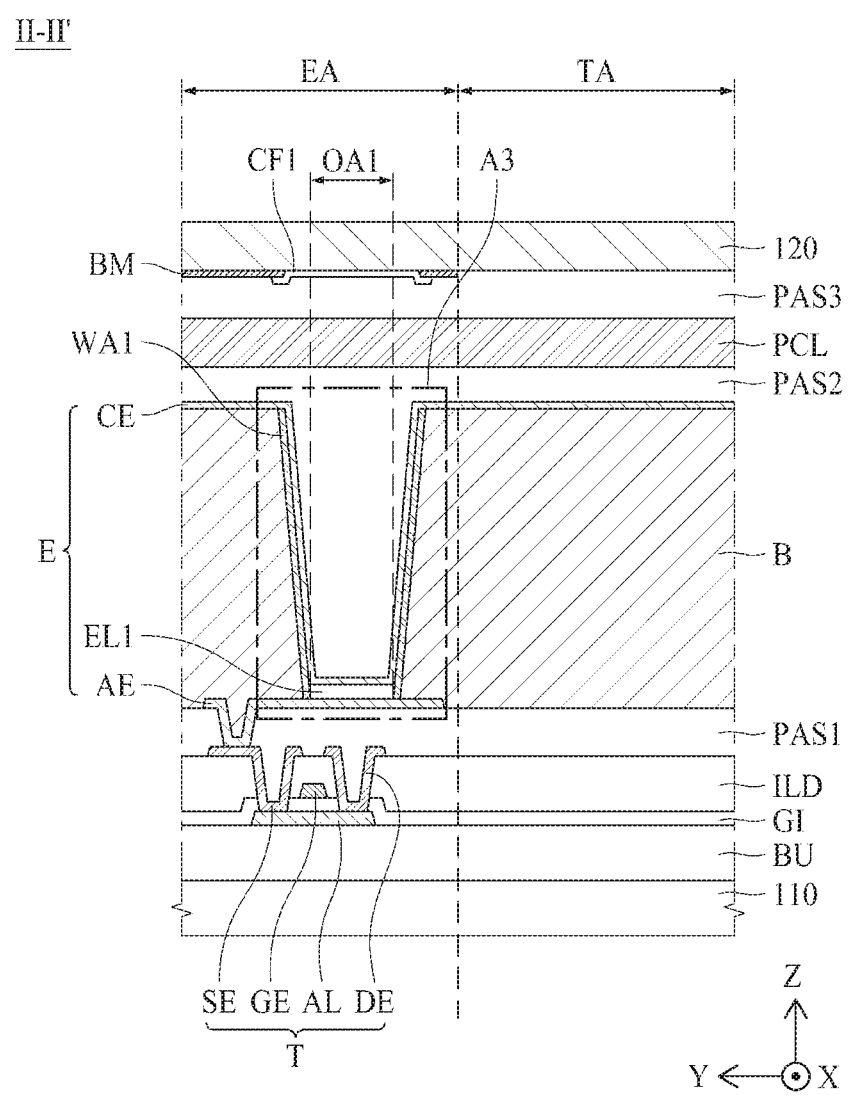
FIG. 8 is a cross-sectional view along to line II-II' shown in FIG. 7.

FIG. 8 is a cross-sectional view along line II-II' shown in FIG. 7. Hereinafter, the same or similar elements or configurations with those shown in FIG. 3 will be omitted or briefly described.

Referring to FIG. 8, the display apparatus 100 can comprise a substrate 110, a buffer layer BU, a gate insulating layer GI, an intermediate insulating layer ILD, a thin film transistor T, a planarization layer PAS1, an emission element E, a bank B, a first wave absorber WA1, a first encapsulation layer PAS2, a second encapsulation layer PCL, a third encapsulation layer PAS3, a first color filter CF1, a black matrix BM and an upper substrate 120.

The first wave absorber WA1 can be disposed at both sides of the first aperture area OA1 of the first sub pixel SP1 to absorb light in the first wavelength band. In one example, the first wave absorber WA1 can cover the side wall surface of the bank B exposing the first aperture area OA1 of the first sub pixel SP1.

For example, the first emission layer EL1 disposed in the first aperture area OA1 can radiate or emit light in the first wavelength band, and the first wave absorber WA1 can absorb the light in the first wavelength band. In detail, the light in the first wavelength band propagating to the vertical direction (Z-axis) can pass through the first color filter CF1 and go out to the front direction of the display apparatus 100. In the interim, many portions of the light in the first wavelength band propagating to the direction between the second horizontal direction (Y-axis) and the vertical direction (Z-axis) can be absorbed by the first wave absorber WA1. In other words, when the first wave absorber WA1 is disposed at the upper side and the lower side of the first aperture area OA1, the first wave absorber WA1 can prevent the light in the first wavelength band from propagating to the upper side and the lower side of the display apparatus 100, so that the side viewing angle of the display apparatus 100 can be controlled.

In one example, the first emission layer EL1 can include a hole injection layer (HIL), a hole transport layer (HTL), an emitting layer (EML), an electron transport layer (ETL) and an electron injection layer (EIL) (not shown). For example, the hole injection layer (HIL), the hole transport layer (HTL), the emitting layer (EML), the electron transport layer (ETL) and the electron injection layer (EIL) can be sequentially stacked between the anode electrode AE and the cathode electrode CE. Here, the hole injection layer (HIL) and the hole transport layer (HTL) may not be divided by per pixel but be commonly disposed over the whole pixels. The emitting layer (EML) can be disposed within the first aperture area OA1 of the first sub pixel SP1 after depositing the hole injection layer (HIL) and the hole transport layer (HTL). The electron transport layer (ETL) and the electron injection layer (EIL) can be commonly disposed over the whole pixels, not divided by per pixel, after forming the emitting layer (EML). The emitting layer (EML) of the first emission layer EL1 is disposed at the first aperture area OA1 and radiates the light in the first wavelength band. The hole injection layer (HIL), the hole transport layer (HTL), the electron transport layer (ETL) and the electron injection layer (EIL) can be disposed between the cathode electrode CE and the bank B or between the first wave absorber WA1 and the cathode electrode CE, at the area where the hole injection layer (HIL), the hole transport layer (HTL), the emitting layer (EML), the electron transport layer (ETL), and the electron injection layer (EIL) are not overlapped with the first aperture area OA1.

In one example, the hole injection layer HIL, the hole transport layer HTL, the electron transport layer ETL and the electron injection layer EIL can cover the first wave absorber WA1. In detail, the hole injection layer HIL, the hole transport layer HTL, the electron transport layer ETL and the electron injection layer EIL can be disposed as covering one side wall surface of the first wave absorber WA1 at the area where they are not overlapped with the first aperture area OA1, and the other side wall surface of the first wave absorber WA1 can contact the side wall surface of the bank B.

In one embodiment, the first wave absorber WA1 can be disposed between the cathode electrode CE and the bank B. For example, one side wall surface of the first wave absorber WA1 can contact with the cathode electrode CE and the other side wall surface of the first wave absorber WA1 can be contact with the bank B. In detail, the bank B can be formed by depositing an organic material (or resin) on the anode electrode AE and the planarization layer PAS1 and removing some portions of the organic material corresponding to the area where the first wave absorber WA1 and the first emission layer EL1 are disposed. The first aperture area OA1 can be formed by removing the organic material (or resin) of the bank B using the photo resist process and the wet etching process. The side wall surface of the bank B and major middle portions of the anode electrode AE can be exposed through the first aperture area OA1. The first wave absorber WA1 can be disposed on the both side wall surfaces of the first aperture area OA1, and the first emission layer EL1 can cover the upper surface of the anode electrode AE within the first aperture area OA1, as shown in FIGS. 7 and 8. The first wave absorber WA1 can be formed by depositing the material absorbing light in the first wavelength band on the side wall surface of the bank B. The cathode electrode CE can be disposed as covering the upper surface of the bank B, the side wall surface of the first wave absorber WA1 and the upper surface of the first emission layer ELL Therefore, the one side wall surface of the first wave absorber WA1 can be facing the cathode electrode CE and the first emission layer EL1, the other side wall surface of the first wave absorber WA1 can contact with the side wall surface of the bank B, the lower surface of the first wave absorber WA1 can contact with the anode electrode AE, and the upper surface of the first wave absorber WA1 can be covered by the cathode electrode CE.

The method for manufacturing the first wave absorber WA1 is not limited the above mentioned method. Using other method(s), the first wave absorber WA1 can be formed at the both sides of the first aperture area OA1 in parallel.

Figure 9:
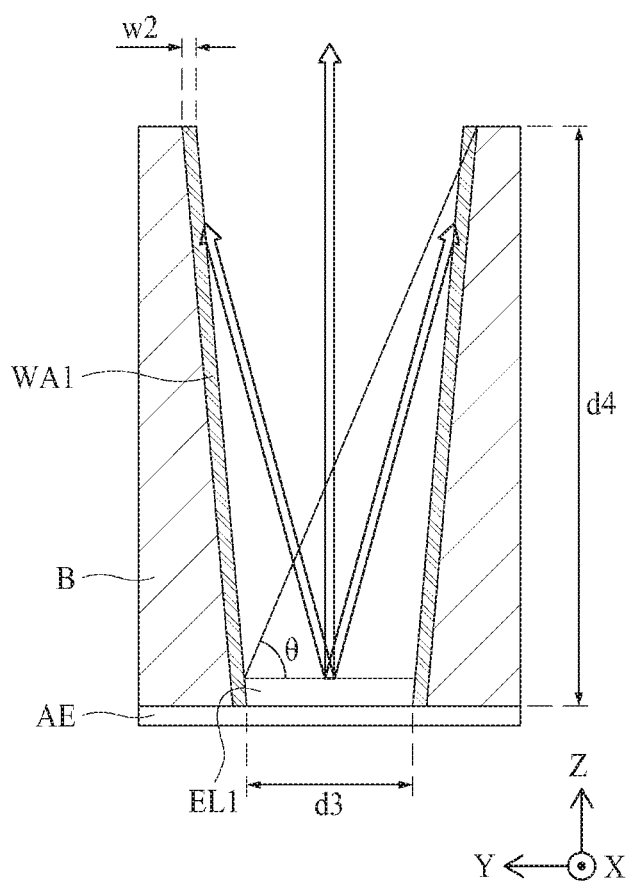
FIG. 9 is an enlarged view of A3 in FIG. 8, illustrating the control of a viewing angle in a first sub pixel.

FIG. 9 is an enlarged view of A3 in FIG. 8, illustrating a control of a viewing angle in the first sub pixel. Hereinafter, the description for controlling the viewing angle of the second and third sub pixel SP2 and SP3 are not duplicated.

Referring to FIG. 9, as disposed at both sides of the first aperture area OA1 of the first sub pixel SP1, the first wave absorber WA1 can absorb the light in the first wavelength band (or first band light C1). For example, the first band light C1 can correspond to red light.

In one embodiment, the vertical length (height) d4 along Z-axis of the first wave absorber WA1 can be 3 times to 4 times of the horizontal length d3 along Y-axis of the first aperture area OA1. In the case that the ratio of the horizontal length d3 along Y-axis of the first aperture area OA1 to the vertical length (height) d4 along Z-axis of the first wave absorber WA1 is 1:3.5, the first wave absorber WA1 can absorb the first band light C1 propagating between the second horizontal direction (Y-axis) and the vertical direction (Z-axis) so that the viewing angle can be effectively controlled or adjusted to have narrow viewing angle, without any additional light control film upon the display apparatus 100.

In one example, the angle, θ, between the second horizontal line along Y-axis and the line from one end of the first emission layer EL1 to the upper end of the first wave absorber WA1 disposed at the opposite end of the first emission layer EL1 can be one of 70° to 80°. In the case that the angle θ between the line from one end of the first emission layer EL1 to the upper end of the first wave absorber WA1 disposed at the opposite end of the first emission layer EL1 and the second horizontal line along Y-axis is 74°, the first wave absorber WA1 can absorb the first band light C1 propagating to the direction between the second horizontal direction (Y-axis) and the vertical direction (Z-axis) so that the viewing angle can be effectively controlled or adjusted to have narrow viewing angle, without any additional light control film upon the display apparatus 100.

In one example, the thickness w2 of the first wave absorber WA1 can be 1 μm (micrometer) or less. As having a thickness of tens of nanometers, the first wave absorber WA1 can enhance the aperture ratio or transparency (or transmittance) of the display apparatus 100 while controlling the viewing angle of the display apparatus 100. When the conventional light control film has a light blocking pattern of micrometers thickness, as the light blocking pattern has the light absorbing material (i.e., black resin), the aperture ratio 100 and/or the transparency of display apparatus can be reduced. To solve these problem, the display apparatus 100 according to the present disclosure can include the first wave absorber WA1 having a thickness of 1 μm (micrometer) or less to enhance the aperture ratio and transparency of the display apparatus 100 than the conventional light control film.

For example, the first wave absorber WA1 can include a material for absorbing the first band light C1 and transmitting the lights in the second wavelength band and the third wavelength band. In the case that the light in the first wavelength band is red light, the light in the second wavelength band is green light and the third light in the third wavelength band is blue light, the first wave absorber WA1 can absorb the red light, and transmit the green light and the blue light. When a light absorber having black resin of 1 μm thickness or less is disposed at both sides of the first aperture area OA1, this light absorber can absorb the lights in all wavelength band, but the light absorption ratio for the light in the first wavelength band can be lower than that of the first wave absorber WA1 according to the present disclosure. As the first wave absorber WA1 includes the material for absorbing the light in the first wavelength band, the absorption ratio of light in the first wavelength band can be increased or enhanced.

Each of the first wave absorber WA1, the second wave absorber WA2 and the third wave absorber WA3 according to the present disclosure includes materials absorbing the first band light C1, the second band light C2 and the third band light C3, respectively. Therefore, the aperture ratio and the transparency of the display apparatus 100 can be enhanced and the absorption ratio for the corresponding band lights C1, C2 and C3 can be improved much more than the display apparatus having the conventional light control film, so that the viewing angle can be effectively controlled.

The display apparatus 100 according to the second embodiment of the present disclosure can include the first wave absorber WA1 at the inner side of the first aperture area OA1 so that it can be not required to configure the area for disposing the first wave absorber WA1 separately. In this case, the shape of the first wave absorber WA1 can be defined according to the shape of the side wall of the first aperture area OA1. For example, the first wave absorber WA1 can be formed at both sides of the first aperture area OA1 or the wall surface of the bank B which is exposed by patterning the first aperture area OA1. In this case, as the first aperture area OA1 is formed as a cube shape of which upper surface has a rectangular shape, the first wave absorber WA1 can have a straight line extending along the first horizontal direction (X-axis). The display apparatus 100 according to the present disclosure can control the viewing angle without any additional light control film.

Figure 10:
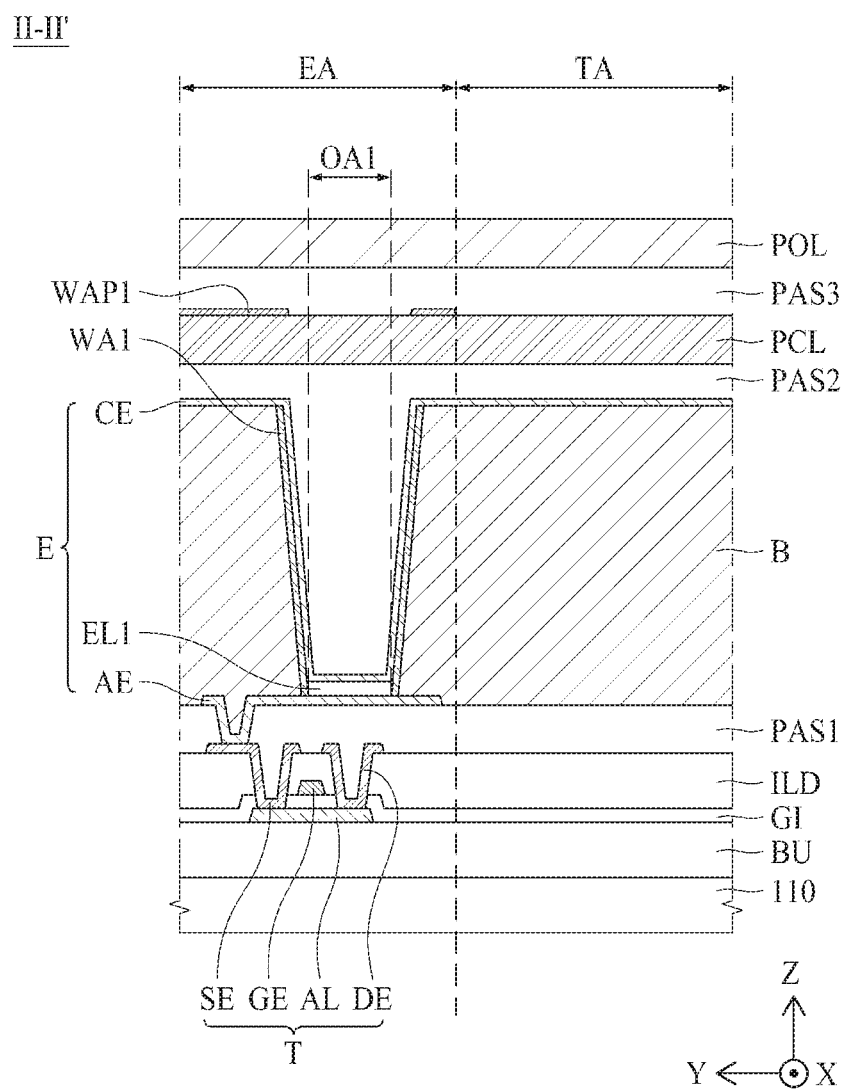
FIG. 10 is a cross-sectional view along the line II-II' in FIG. 7, illustrating a display apparatus according to a third embodiment of the present disclosure.

FIG. 10 is a cross-sectional view along the line II-II' in FIG. 7, illustrating a display apparatus according to the third embodiment of the present disclosure. The display apparatus according to the third embodiment includes a first wave absorber pattern WAP1 as well as a polarization film POL. The same or similar configurations or elements as those of the display apparatus according to the second embodiment shown in FIG. 8 may not be duplicately explained.

The first to third encapsulation layers PAS2, PCL and PAS3 can be sequentially stacked on the emission element E for preventing foreign material and moisture from intruding into the emission element E, so as to prevent the emission element E from being degraded.

The first wave absorber pattern WAP1 can be patterned at both side portions of the first aperture area OA1 on the second encapsulation layer PCL. In detail, the first wave absorber pattern WAP1 can be disposed at circumferences of the first aperture area OA1 as corresponding to the first wave absorber WA1. For example, each of the first wave absorber WA1 and the first wave absorber pattern WAP1 is disposed at upper and lower portions, respectively, surrounding the first aperture area OA1. In that case, the first wave absorber pattern WAP1 can absorb some of lights, which are not absorbed by the first wave absorber WA1 of the light in the first wavelength band radiated to upper and lower direction of the display apparatus 100. The first wave absorber pattern WAP1 can compensate or supplement the viewing angle control function of the first wave absorber WA1. In one example, the display apparatus according to the third embodiment can have the first wave absorber WA1 having relatively lower height along vertical direction (Z-axis) than those of the first and second embodiments. In this case, as further having the first wave absorber pattern WAP1, the viewing angle control function can be supplemented or compensated. Here, the thickness of the display apparatus according to the third embodiment can be thinner than the thicknesses of the display apparatuses according to the first and second embodiments.

In one example, the first wave absorber pattern WAP1 can include an organic material for absorbing light in the first wavelength band. The first wave absorber pattern WAP1 can include the same material as the first wave absorber WA1. In the case that the first wave absorber pattern WAP1 includes different material from the first wave absorber WA1, the first wave absorber pattern WAP1 and the first wave absorber WA1, respectively, can include an organic material for absorbing light in the first wavelength band.

The polarization film POL can be disposed on the third encapsulation layer PAS3. The polarization film POL can prevent reflection of ambient light or external light incident from the outside, and can improve contrast ratio of the display apparatus 100.

Figure 11:
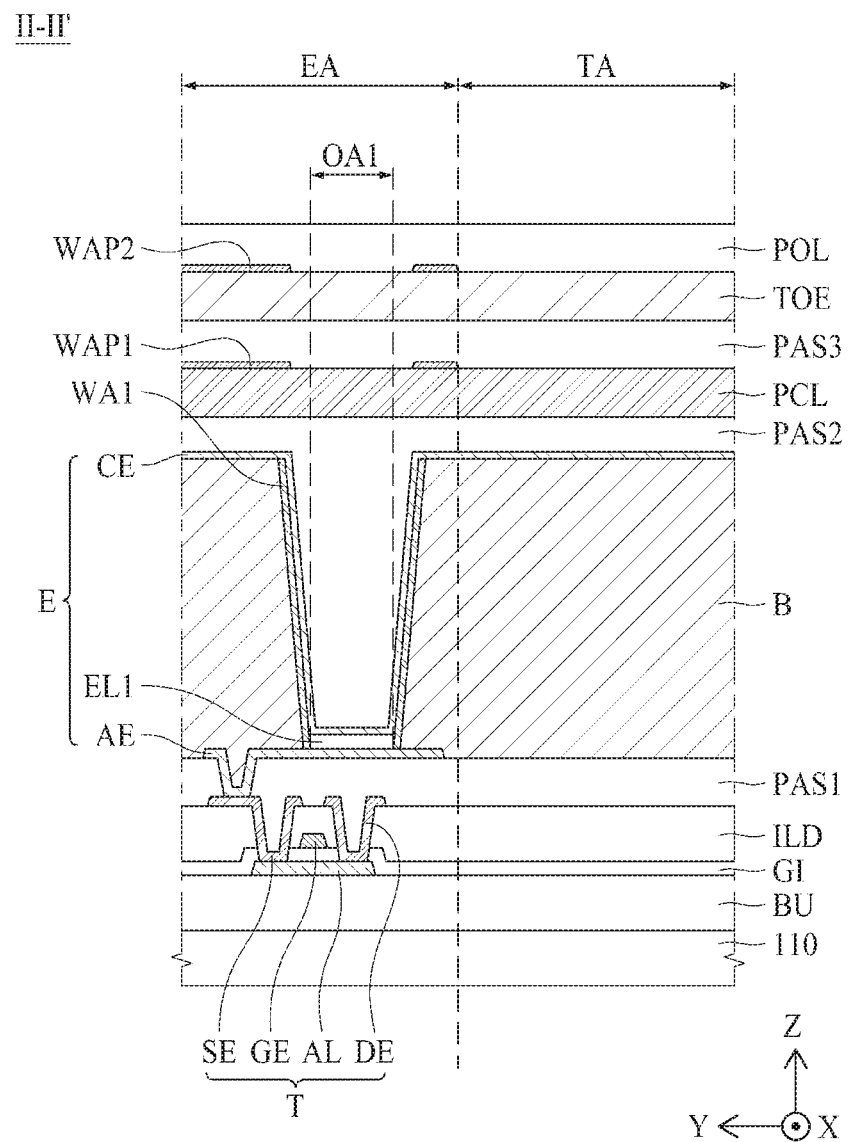
FIG. 11 is a cross-sectional view along the line II-II' in FIG. 7, illustrating a display apparatus according to a fourth embodiment of the present disclosure.

FIG. 11 is a cross-sectional view along the line II-II' in FIG. 7, illustrating a display apparatus according to the fourth embodiment of the present disclosure. The display apparatus according to the fourth embodiment can have a second wave absorber pattern WAP2 and a touch layer TOE. The same or similar configurations or elements as those of the third embodiment may not be duplicately explained.

The first to third encapsulation layers PAS2, PCL and PAS3 can be sequentially stacked on the emission element E for preventing foreign material and moisture from intruding into the emission element E, so as to prevent the emission element E from being degraded.

The first wave absorber pattern WAP1 can be patterned at both side portions of the first aperture area OA1 on the second encapsulation layer PCL. In detail, the first wave absorber pattern WAP1 can be disposed at circumferences of the first aperture area OA1 as corresponding to the first wave absorber WA1. For example, each of the first wave absorber WA1 and the first wave absorber pattern WAP1 is disposed at upper and lower portions, respectively, surrounding the first aperture area OA1. In that case, the first wave absorber pattern WAP1 can absorb some of lights, which are not absorbed by the first wave absorber WA1 of the light in the first wavelength band radiated to upper and lower direction of the display apparatus 100. The first wave absorber pattern WAP1 can compensate or supplement the viewing angle control function of the first wave absorber WA1.

The touch layer TOE can disposed on the third encapsulation layer PAS3 and detect the position and pressure of touch input from the outside of the display apparatus 100. For example, the touch layer TOE can include at least one touch electrode. The touch layer TOE can be configured as the self capacitance type or the mutual capacitance type.

The second wave absorber pattern WAP2 can be patterned at the both side portions of the first aperture area OA1 on the touch layer TOE. In detail, the second wave absorber pattern WAP2 can be disposed at circumferences of the first aperture area OA1 as corresponding to the first wave absorber WA1 and the first wave absorber pattern WAP1. For example, each of the first wave absorber WA1, the first wave absorber pattern WAP1 and the second wave absorber pattern WAP2, respectively, are disposed at upper and lower portions as surrounding the first aperture area OA1. In this case, the second wave absorber pattern WAP2 can absorb some of lights, which are not absorbed by the first wave absorber WA1, and the first wave absorber pattern WAP1 of the lights in the first wavelength band radiated to upper and lower direction of the display apparatus 100. The second wave absorber pattern WAP2 can compensate or supplement the viewing angle control function of the first wave absorber WA1 and the first wave absorber pattern WAP1. In one example, the display apparatus according to the fourth embodiment can have the first wave absorber WA1 having relatively lower height along vertical direction (Z-axis) than those of the first to third embodiments. In this case, as further having the first wave absorber pattern WAP1 and the second wave absorber pattern WAP2, the viewing angle control function can be supplemented or compensated. Here, the thickness of the display apparatus according to the fourth embodiment can be thinner than the thicknesses of the display apparatuses according to the first to third embodiments.

In one example, the second wave absorber pattern WAP2 can include an organic material for absorbing light in the first wavelength band. The second wave absorber pattern WAP2 can include the same materials as the first wave absorber WA1 and the first wave absorber pattern WAP1. In the case that the second wave absorber pattern WAP2 includes different material from the first wave absorber WA1 or the first absorber pattern WAP1, the first wave absorber pattern WAP1, the second wave absorber pattern WAP2 and the first wave absorber WA1, respectively, can include an organic material for absorbing light in the first wavelength band.

The polarization film POL can be disposed on the touch layer TOE and the second wave absorber pattern WAP2. The polarization film POL can prevent reflection of ambient light or external light incident from the outside, and can improve contrast ratio of the display apparatus 100.

Figure 12:
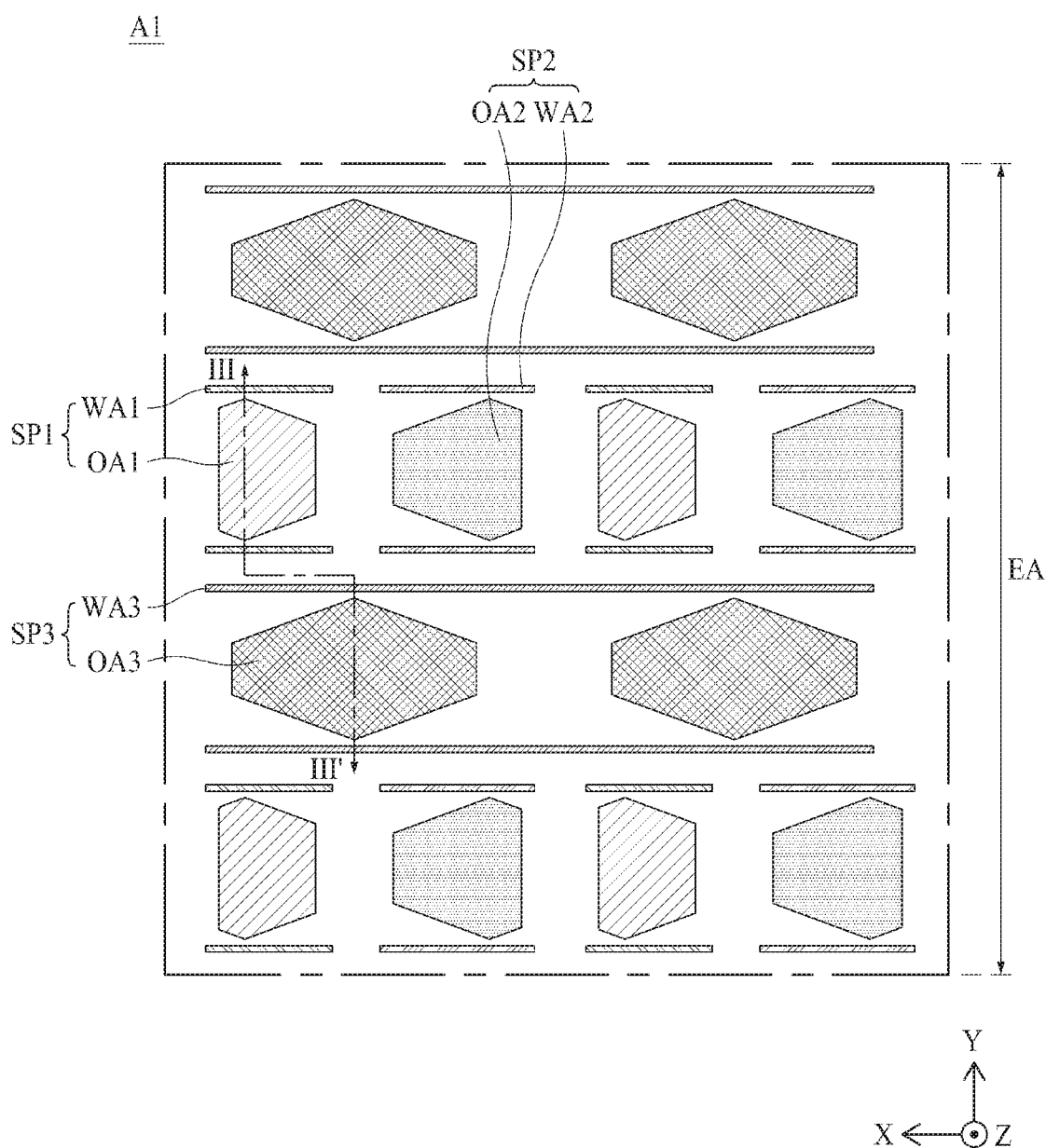
FIG. 12 is an enlarged view of A1 in FIG. 1, illustrating a display apparatus according to a fifth embodiment of the present disclosure.
Figure 13:
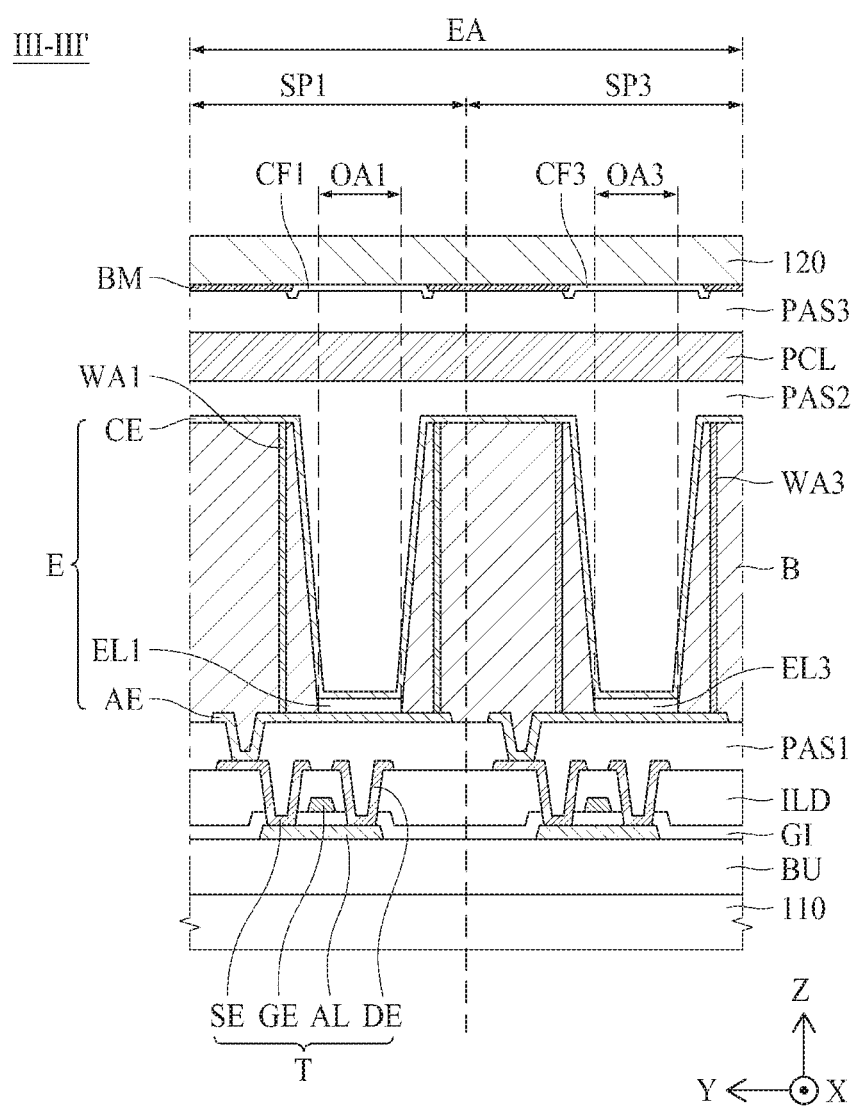
FIG. 13 is a cross-sectional view along line III-III' shown in FIG. 12.

FIG. 12 is an enlarged view of A1 in FIG. 1, illustrating a display apparatus according to the fifth embodiment of the present disclosure. FIG. 13 is a cross-sectional view along line III-III' shown in FIG. 12. The display apparatus according to the fifth embodiment does not have the transparent area for passing lights through the display panel. The same or similar configurations or elements as those of the first to fourth embodiments may not be duplicately explained.

Referring to FIGS. 1, 12 and 13, the substrate 110 can include a display area AA and a non-display area NA. The display area AA can include an emission area EA having a plurality of pixels for radiating lights.

The emission area EA can include a plurality of sub pixels, where each of the sub pixels can be defined as the unit area for radiating light. For example, the emission area EA can include at least three sub pixels SP1, SP2 and SP3 adjacent to each other. The first sub pixel SP1 can be configured as the red sub pixel radiating the red color light, the second sub pixel SP2 can be configured as the green sub pixel radiating the green color light, and the third sub pixel SP3 can be configured as the blue sub pixel radiating the blue color light. However, it is not necessarily limited to this configuration. Further, the emission area EA can correspond to an opaque area in which incident light is not transmitted but blocked.

In one example, a plurality of third aperture area OA3 can be arrayed along the first row in a plan consisting of the first horizontal line (X-axis) and the second horizontal line (Y-axis). The third wave absorber WA3 can be disposed at upper side and lower side of the plurality of third aperture area OA3 and extending along the first horizontal direction (X-axis). A plurality of the first aperture area OA1 and a plurality of the second aperture area OA2 can be alternately arrayed along the second row. Each of the first and second wave absorbers WA1 and WA2 are disposed at upper side and the lower side of the first and second aperture areas OA1 and OA2, respectively, and they are alternately disposed along the first horizontal direction (X-axis). The first to third sub pixels SP1, SP2 and SP3 can be alternately arrayed along the third row or later rows as the same manner as the first and second rows.

Figure 14:
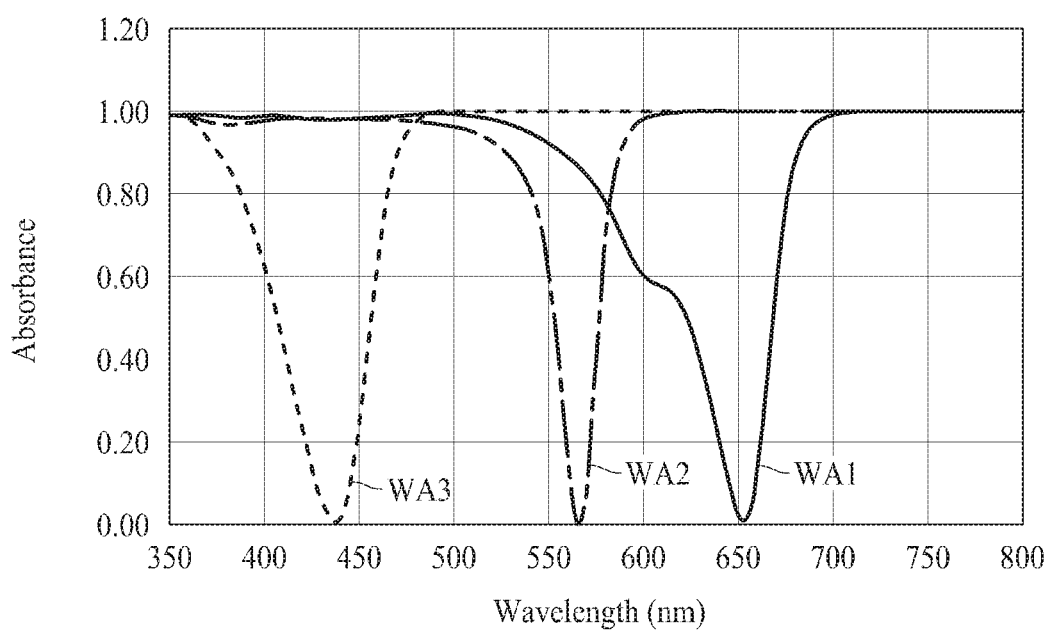
FIG. 14 is a graph illustrating examples of the absorbances of first, second and third wave absorbers in the display apparatus according to one embodiment of the present disclosure.

FIG. 14 is a graph illustrating the absorbances of the first, second and third wave absorbers in the display apparatus according to one embodiment of the present disclosure.

Referring to FIG. 14, based on the 0.80 of the absorbance, the first wave absorber WA1 can absorb lights in the wavelength band of 630 nm to 670 nm, and transmit lights in other wavelength bands. For example, the first wave absorber WA1 can absorb the red light but transmit the green and blue lights.

The second wave absorber WA2 can absorb lights in the wavelength band of 540 nm to 580 nm, and transmit lights in other wavelength bands. For example, the second wave absorber WA2 can absorb the green light but transmit the red and blue lights.

The third wave absorber WA3 can absorb lights in the wavelength band of 380 nm to 470 nm, and transmit lights in other wavelength bands. For example, the third wave absorber WA3 can absorb the blue light but transmit the red and green lights.

Therefore, each of the first to third wave absorber WA1, WA2 and WA3 according to the present disclosure can include materials absorbing each light in the corresponding wavelength band, but transmitting lights in other wavelength bands. In the case of the light absorption element including a black resin and thickness being 1 μm or less at both sides of the aperture area, the light absorption element can absorb lights in all wavelength bands, but the light absorption element can have lower light absorption rate for the light in a specific wavelength band than the wave absorber WA1, WA2 and WA3 according to the present disclosure. As the first to third wave absorbers WA1, WA2 and WA3 include the material for absorbing respective lights in the first to third wavelength bands, respectively, the absorption ratio for lights in the first to third wavelength bands can be more increased or enhanced than the black resin light absorption element.

Consequently, as including a wave absorber for absorbing light in a specific wavelength band, the display apparatus according to the present disclosure can control the viewing angle without any additional light control film so that the thickness of the whole display apparatus cannot be thicker as well as the aperture ratio and the transparency of the display apparatus can be enhanced. In addition, by adjusting the size (such as width) of the aperture areas, the height of the wave absorber and the thickness of the wave absorber, the display apparatus according to the present disclosure can control the viewing angle without any additional light control film.

The display apparatus according to one or more embodiments of the present disclosure can also be configured as follows.

A display apparatus according to the present disclosure can include an anode electrode electrically connected to a thin film transistor disposed on a substrate of the display apparatus; a bank defining an aperture area exposing a portion of the anode electrode; an emission layer disposed on the anode electrode and radiating a light in a specific wavelength band; and a wave absorber disposing at both sides of the aperture area and absorbing the light in the specific wavelength band.

In some examples, a side wall surface of the wave absorber is surrounded by the bank.

In some examples, the display apparatus further can include a cathode electrode covering the bank and the emission layer, wherein the wave absorber is disposed between the anode electrode and the cathode electrode.

In some examples, the wave absorber is extended along a first horizontal direction and is disposed as being separated from the aperture area along a second horizontal direction perpendicular to the first horizontal direction.

In some examples, the wave absorber covers a side wall surface of the bank surrounding the aperture area.

In some examples, the display apparatus further can include a cathode electrode covering the bank, the wave absorber and the emission layer, wherein the wave absorber is disposed between the cathode electrode and the bank.

In some examples, the wave absorber contacts both sides of the emission layer disposed at the aperture area, and extends along the first horizontal direction.

In some examples, a length of the wave absorber along a vertical direction perpendicular to the first and second horizontal directions is 3 times to 4 times of a maximum length of the aperture area along the second horizontal direction.

In some examples, an angle between a first line along the second horizontal direction and a second line connecting one end of the emission layer and an upper end of the wave absorber opposite the one end of the emission layer is in range of 70° to 80°.

In some examples, a thickness of the wave absorber is 1 μm or less.

In some examples, the display apparatus further can include a cathode electrode covering the emission layer; an encapsulation layer covering the cathode electrode; and a color filter disposed over the encapsulation layer and overlapping with the aperture area.

In some examples, the wave absorber is disposed at both sides of the color filter.

In some examples, the display apparatus further can include a cathode electrode covering the bank, the wave absorber and the emission layer; a first encapsulation layer over the cathode electrode; a second encapsulation layer over the first encapsulation layer; and a first wave absorber pattern surrounding the aperture area on the second encapsulation layer, and including same material as the wave absorber.

In some examples, the display apparatus further can include a third encapsulation layer overlaying the first wave absorber pattern and the second encapsulation layer; a touch layer disposed on the third encapsulation layer; and a second wave absorber pattern surrounding the aperture area on the touch layer, and including same material as the wave absorber.

In some examples, the substrate can include a transparent area transmitting incident light, and an emission area having a plurality of pixels for radiating light. In addition, the emission area includes the plurality of aperture areas defined by the bank.

A display apparatus according to the present disclosure can include a substrate including a display area having a plurality of pixels; a bank disposed on the substrate for defining an aperture area of each of the plurality of pixels; an emission layer disposed at each of aperture areas of the plurality of pixels for radiating lights of respective wavelength bands of a first wavelength band, a second wavelength band and a third wavelength band; and a first wave absorber, a second wave absorber and a third wave absorber disposed at both sides of the aperture areas of respective pixels, and absorbing the light of the first wavelength band, the light of the second wavelength band and the light of the third wavelength band, respectively, radiated from the respective aperture areas.

In some examples, each of the first to third wave absorbers is extended along a first horizontal direction and disposed apart from the aperture area along a second horizontal direction perpendicular to the first horizontal direction.

In some examples, the each of the first to third wave absorber contacts both sides of the emission layer disposed at respective aperture area and extends along the first horizontal direction.

In some examples, the first to third wave absorber absorb light corresponding to the first to third wavelength bands, respectively, and transmit lights corresponding to other wavelength bands.

In some examples, the display apparatus further can include a first color filter, a second color filter and a third color filter overlapping with the aperture areas of respective pixels, wherein the first to third wave absorbers are disposed at both sides of the first to third color filters, respectively.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
    an anode electrode electrically connected to a thin film transistor disposed on a substrate of the display apparatus;
    a bank defining an aperture area exposing a portion of the anode electrode;
    an emission layer disposed on the anode electrode and radiating a light in a specific wavelength band; and
    a wave absorber disposing at both sides of the aperture area and absorbing the light in the specific wavelength band,
    wherein the wave absorber is extended along a first horizontal direction and is disposed as being separated from the aperture area along a second horizontal direction perpendicular to the first horizontal direction.

2. The display apparatus according to claim 1, wherein a side wall surface of the wave absorber is surrounded by the bank.

3. The display apparatus according to claim 1, further comprising:
    a cathode electrode covering the bank and the emission layer,
    wherein the wave absorber is disposed between the anode electrode and the cathode electrode.

4. The display apparatus according to claim 1, wherein the wave absorber overlays a side wall surface of the bank surrounding the aperture area.

5. The display apparatus according to claim 4, further comprising:

a cathode electrode overlaying the bank, the wave absorber and the emission layer,
wherein the wave absorber is disposed between the cathode electrode and the bank.

6. The display apparatus according to claim 4, wherein the wave absorber contacts both sides of the emission layer disposed at the aperture area.

7. The display apparatus according to claim 1, wherein a length of the wave absorber along a vertical direction perpendicular to the first and second horizontal directions is approximately 3 times to 4 times of a maximum length of the aperture area along the second horizontal direction.

8. The display apparatus according to claim 1, wherein an angle between a first line along the second horizontal direction and a second line connecting one end of the emission layer and an upper end of the wave absorber opposite the one end of the emission layer is in range of approximately 70° to 80°.

9. The display apparatus according to claim 1, wherein a thickness of the wave absorber is approximately 1 μm or less.

10. The display apparatus according to claim 1, further comprising:
a cathode electrode overlaying the emission layer;
an encapsulation layer overlaying the cathode electrode; and
a color filter disposed over the encapsulation layer and overlapping with the aperture area.

11. The display apparatus according to claim 10, wherein the wave absorber is disposed at both sides of the color filter.

12. The display apparatus according to claim 1, further comprising:
a cathode electrode overlaying the bank, the wave absorber and the emission layer;
a first encapsulation layer over the cathode electrode;
a second encapsulation layer over the first encapsulation layer; and
a first wave absorber pattern surrounding the aperture area on the second encapsulation layer, and including a same material as the wave absorber.

13. The display apparatus according to claim 12, further comprising:
a third encapsulation layer covering the first wave absorber pattern and the second encapsulation layer;
a touch layer disposed on the third encapsulation layer; and
a second wave absorber pattern surrounding the aperture area on the touch layer, and including the same material as the wave absorber.

14. The display apparatus according to claim 1, wherein the substrate includes a transparent area transmitting incident light, and an emission area having a plurality of pixels for radiating light, and
wherein the emission area includes a plurality of aperture areas defined by the bank.

15. A display apparatus comprising:
a substrate including a display area having a plurality of pixels;
a bank disposed on the substrate for defining an aperture area of each of the plurality of pixels;
an emission layer disposed at each of aperture areas of the plurality of pixels for radiating lights of a first wavelength band, a second wavelength band and a third wavelength band; and
a first wave absorber, a second wave absorber and a third wave absorber disposed at both sides of the aperture areas of each pixel, and absorbing the light of the first wavelength band, the light of the second wavelength and the light of the third wavelength, respectively, radiated from the aperture area,
wherein each of the first to third wave absorbers is extended along a first horizontal direction and disposed apart from the aperture area along a second horizontal direction perpendicular to the first horizontal direction.

16. The display apparatus according to claim 15, wherein each of the first to third wave absorber is disposed at both sides of the aperture area and extending along the first horizontal direction.

17. The display apparatus according to claim 15, wherein each of the first to third wave absorber absorbs light corresponding to each of the first to third wavelength bands, respectively, and transmits lights corresponding to other wavelength bands.

18. The display apparatus according to claim 15, further comprising:
a first color filter, a second color filter and a third color filter overlapping with the aperture areas of each pixel,
wherein each of the first to third wave absorbers is disposed at both sides of each of the first to third color filters, respectively.

19. A display apparatus comprising:
an anode electrode electrically connected to a thin film transistor disposed on a substrate of the display apparatus;
a bank defining an aperture area exposing a portion of the anode electrode;
an emission layer disposed on the anode electrode and radiating a light in a specific wavelength band; and
a wave absorber disposing at both sides of the aperture area and absorbing the light in the specific wavelength band;
a cathode electrode overlaying the bank, the wave absorber and the emission layer;
a first encapsulation layer over the cathode electrode;
a second encapsulation layer over the first encapsulation layer; and
a wave absorber pattern surrounding the aperture area on the second encapsulation layer, and including a same material as the wave absorber.

* * * * *